(12) United States Patent
Han et al.

(10) Patent No.: US 11,350,531 B2
(45) Date of Patent: May 31, 2022

(54) DISPLAY DEVICE

(71) Applicant: Samsung Display Co. Ltd., Yongin-si (KR)

(72) Inventors: Ji Won Han, Anyang-si (KR); Jai Ku Shin, Hwaseong-si (KR); Seung Ho Jung, Hwaseong-si (KR); Tae Hyeog Jung, Hwaseong-si (KR); Kyung Min Choi, Seoul (KR); Won Baek Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 649 days.

(21) Appl. No.: 16/381,372

(22) Filed: Apr. 11, 2019

(65) Prior Publication Data

US 2020/0022267 A1 Jan. 16, 2020

(30) Foreign Application Priority Data

Jul. 10, 2018 (KR) .......................... 10-2018-0079868

(51) Int. Cl.
| | |
|---|---|
| B32B 3/00 | (2006.01) |
| H05K 5/00 | (2006.01) |
| H05K 5/02 | (2006.01) |
| H05K 5/03 | (2006.01) |
| H01L 51/52 | (2006.01) |
| B32B 17/06 | (2006.01) |
| B32B 7/12 | (2006.01) |
| G06F 1/16 | (2006.01) |

(52) U.S. Cl.
CPC ............. *H05K 5/0017* (2013.01); *B32B 7/12* (2013.01); *B32B 17/06* (2013.01); *G06F 1/1641* (2013.01); *G06F 1/1652* (2013.01); *H01L 51/5246* (2013.01); *H05K 5/0217* (2013.01); *H05K 5/03* (2013.01); *B32B 2457/206* (2013.01); *H01L 2251/5338* (2013.01); *H01L 2251/558* (2013.01)

(58) Field of Classification Search
CPC ................ B32B 7/12; B32B 2457/206; H01L 2251/5338
See application file for complete search history.

(56) References Cited

U.S. PATENT DOCUMENTS

| | | | |
|---|---|---|---|
| 9,661,719 B2 | 5/2017 | Jang et al. | |
| 10,930,883 B2 * | 2/2021 | Park | ...................... G06F 1/1652 |
| 10,966,328 B2 * | 3/2021 | Choi | ...................... B32B 27/36 |

(Continued)

*Primary Examiner* — Elizabeth E Mulvaney
(74) *Attorney, Agent, or Firm* — Cantor Colburn LLP

(57) ABSTRACT

A display device includes a flexible module including a display panel displaying an image, a first adhesive film disposed on one surface of the flexible module, first and second support plates disposed on the first adhesive film, opposed to the flexible module, and spaced apart from each other, a first adhesive protection layer and a first anti-adhesive layer disposed between the first support plate and the first adhesive film and facing each other, and a second adhesive protection layer and a second anti-adhesive layer disposed between the second support plate and the first adhesive film and facing each other, where a first bonding force between the first anti-adhesive layer and the first support plate and a second bonding force between the first adhesive protection layer and the first adhesive film are larger than a third bonding force between the first adhesive protection layer and the first anti-adhesive layer.

20 Claims, 17 Drawing Sheets

(56) References Cited

U.S. PATENT DOCUMENTS

| | | | |
|---|---|---|---|
| 10,986,731 B2* | 4/2021 | Shin | G06F 1/1652 |
| 11,074,836 B2* | 7/2021 | Shin | G09F 9/301 |
| 11,177,458 B2* | 11/2021 | Wang | H01L 51/0097 |

* cited by examiner

DISPLAY DEVICE

This application claims priority to Korean Patent Application No. 10-2018-0079868, filed on Jul. 10, 2018, and all the benefits accruing therefrom under 35 U.S.C. § 119, the content of which in its entirety is herein incorporated by reference.

BACKGROUND

1. Field

Exemplary embodiments of the invention relate to a display device, and more particularly, to a display device which is convertible between a folded state and an unfolded state.

2. Description of the Related Art

A display device displays an image and includes a display panel such as an organic light emitting display panel or a liquid crystal display panel.

A mobile electronic device generally includes the display device for providing the image to a user. A mobile electronic device having a display screen larger than that of a conventional device while having a volume or thickness equal to or smaller than that of the conventional device has been highlighted. In addition, a foldable display device or a bendable display device having a structure that can be folded and unfolded to provide a larger screen at the time of use, has been developed.

SUMMARY

An exemplary embodiment of the invention provides a display device capable of preventing internal modification of the display device due to adhesion of foreign substances or the like to a pressure sensitive adhesive ("PSA") exposed to the outside of the display device, aggregation of the PSA, or the like.

However, exemplary embodiments of the invention are not restricted to the one set forth herein. The above and other exemplary embodiments of the invention will become more apparent to one of ordinary skill in the art to which the invention pertains by referencing the detailed description of the invention given below.

According to an exemplary embodiment of the invention, there is provided a display device, the display device includes a flexible module including a display panel displaying an image, a first adhesive film disposed on one surface of the flexible module, a first support plate and a second support plate which are disposed on the first adhesive film, opposed to the flexible module, and spaced apart from each other, respectively, a first adhesive protection layer and a first anti-adhesive layer disposed between the first support plate and the first adhesive film and facing each other, and a second adhesive protection layer and a second anti-adhesive layer disposed between the second support plate and the first adhesive film and facing each other, where a first bonding force between the first anti-adhesive layer and the first support plate and a second bonding force between the first adhesive protection layer and the first adhesive film are larger than a third bonding force between the first adhesive protection layer and the first anti-adhesive layer, and a side surface of the first adhesive protection layer and a side surface of the first anti-adhesive layer are aligned with a side surface of the first support plate.

In an exemplary embodiment, a fourth bonding force between the second anti-adhesive layer and the second support plate and a fifth bonding force between the second adhesive protection layer and the second adhesive film may be larger than a sixth bonding force between the second adhesive protection layer and the second anti-adhesive layer, and one side surfaces of the second adhesive protection layer and the second anti-adhesive layer are aligned with one side surface of the second support plate.

In an exemplary embodiment, in a region where the first anti-adhesive layer and the first adhesive protection layer may be exposed, the flexible module is directly bonded with the first support plate overlapped in a thickness direction.

In an exemplary embodiment, in a region where the second anti-adhesive layer and the second adhesive protection layer are exposed, the flexible module may be directly bonded with the second support plate overlapped in the thickness direction.

In an exemplary embodiment, the first adhesive film may be in contact with the side surfaces of the first adhesive protection layer and the first anti-adhesive layer and in contact with a side surface of the second adhesive protection layer and a side surface of the second anti-adhesive layer.

In an exemplary embodiment, the first adhesive protection layer and the second adhesive protection layer may include inorganic materials.

In an exemplary embodiment, the first anti-adhesive layer and the second anti-adhesive layer may include at least one of olefin, silicon, long-chain alkyl, and fluorine-based molecules.

In an exemplary embodiment, thicknesses of the first adhesive protection layer and the second adhesive protection layer may be about 1 nanometer (nm) to about 10 nm.

In an exemplary embodiment, thicknesses of the first anti-adhesive layer and the second anti-adhesive layer may be about 10 nm to about 20 nm.

In an exemplary embodiment, the first adhesive film may include a PSA.

In an exemplary embodiment, the flexible module may further include a lower functional layer disposed on the display panel and disposed between the display panel and the first adhesive film, an upper functional layer disposed on the display panel and spaced apart from the lower functional layer with the display panel interposed therebetween, and a window member disposed on the upper functional layer and spaced apart from the display panel with the upper functional layer interposed therebetween, where the lower functional layer, the display panel, the upper functional layer, and the window member face each other.

In an exemplary embodiment, the flexible module may further include a second adhesive film for bonding the lower functional layer and the display panel, a third adhesive film for bonding the display panel and the upper functional layer, and a fourth adhesive film for bonding the upper functional layer and the window member.

In an exemplary embodiment, the window member may include glass, and a thickness of the window member is equal to or less than about 100 micrometers (μm).

In an exemplary embodiment, a thickness of the first adhesive film may be smaller than a thickness of the second adhesive film, the third adhesive film, and the fourth adhesive film.

According to an exemplary embodiment of the invention, there is provided a display device, the display device includes a first region, a second region, a third region, a fourth region and a fifth region adjacent to each other, the display device further includes a flexible module, a first adhesive film disposed on the flexible module, a first adhesive protection layer and a second adhesive protection layer disposed on the adhesive layer, a first support plate and a second support plate facing the flexible module, a first anti-adhesive layer disposed on the first support plate, and a second anti-adhesive layer disposed on the second support plate, where the flexible module and the first adhesive film are disposed over the first region to the fifth region, the first support plate is disposed over the first region and the second region, the first anti-adhesive layer and the first adhesive protection layer are disposed in the second region, the second support plate is disposed over the fourth region and the fifth region, the second anti-adhesive layer and the second adhesive protection layer are disposed in the fourth region, the first anti-adhesive layer and the first adhesive protection layer face each other, the second anti-adhesive layer and the second adhesive protection layer face each other, first side surfaces of the first support plate, the first adhesive protection layer, and the first anti-adhesive layer are aligned on a boundary between the second region and the third region, respectively, second side surfaces of the second support plate, the second adhesive protection layer, and the second anti-adhesive layer are aligned on a boundary between the third region and the fourth region, respectively, the first side surfaces and the second side surfaces are spaced apart from each other with the third region interposed therebetween to face each other, the first anti-adhesive layer is bonded onto the first support plate, the second anti-adhesive layer is bonded onto the second support plate, the first adhesive protection layer and the second adhesive protection layer are bonded onto the first adhesive film, the first support plate is directly bonded to the first adhesive film in the first region, and the second support plate is directly bonded to the first adhesive film in the fifth region.

In an exemplary embodiment, the first adhesive protection layer and the second adhesive protection layer may include inorganic materials, and the first anti-adhesive layer and the second anti-adhesive layer include at least one of olefin, silicon, long-chain alkyl, and fluorine-based molecules.

In an exemplary embodiment, thicknesses of the first adhesive protection layer and the second adhesive protection layer may be about 1 nm to about 10 nm, and thicknesses of the first anti-adhesive layer and the second anti-adhesive layer are about 10 nm to about 20 nm.

In an exemplary embodiment, the flexible module may further include a display panel, a lower functional layer disposed on the display panel and disposed between the display panel and the first adhesive film, an upper functional layer disposed on the display panel and spaced apart from the lower functional layer with the display panel interposed therebetween, a window member disposed on the upper functional layer and spaced apart from the display panel with the upper functional layer interposed therebetween, a second adhesive film for bonding the lower functional layer and the display panel, a third adhesive film for bonding the display panel and the upper functional layer, and a fourth adhesive film for bonding the upper functional layer and the window member.

In an exemplary embodiment, a thickness of the first adhesive film may be smaller than a thickness of the second adhesive film, the third adhesive film, and the fourth adhesive film, and the first adhesive film to the fourth adhesive film include a PSA.

In an exemplary embodiment, the window member includes glass, and the thickness of the window member may be equal to or less than about 100 μm.

BRIEF DESCRIPTION OF THE DRAWINGS

The above and other exemplary embodiments and features of the invention will become more apparent by describing in detail exemplary embodiments thereof with reference to the attached drawings, in which.

DETAILED DESCRIPTION

Figure 1:
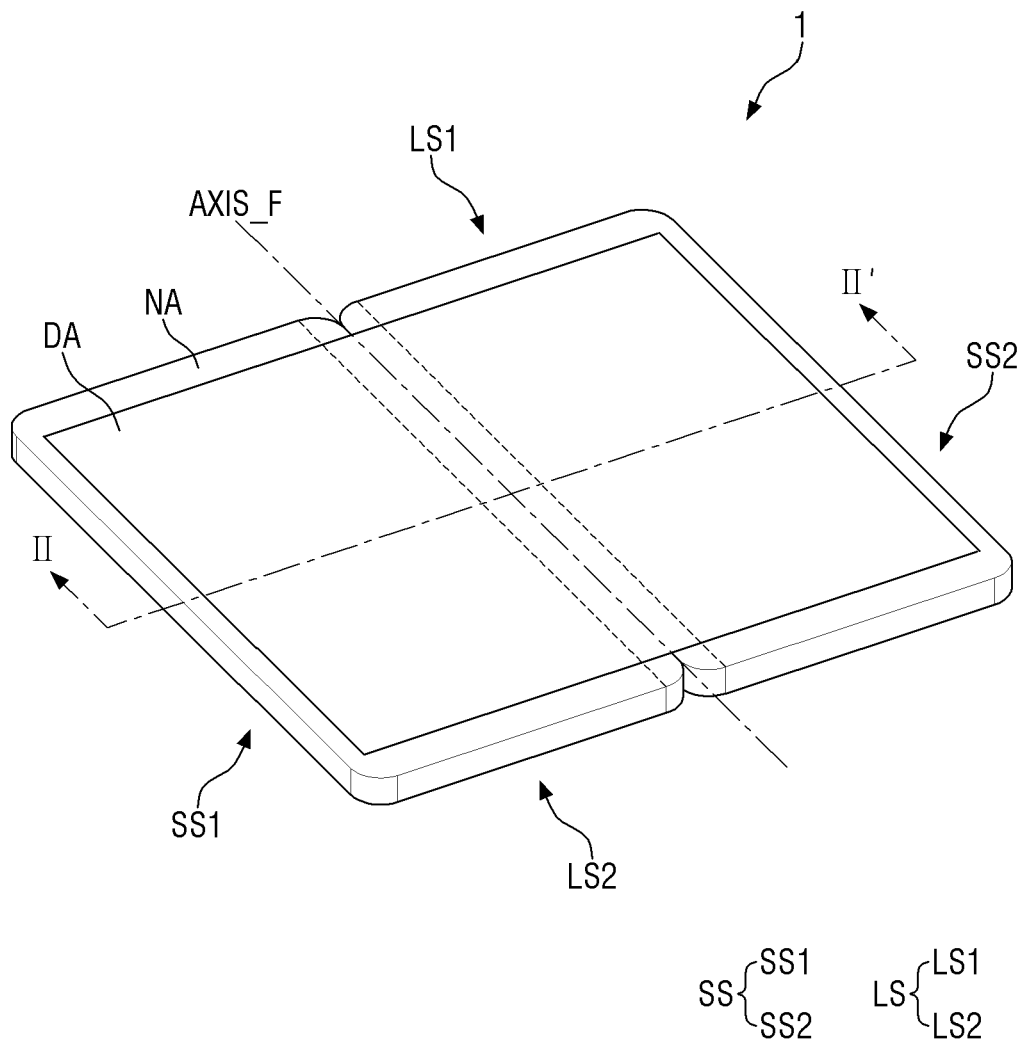
FIG. 1 is a perspective view of an exemplary embodiment of a display device.

The advantages and features of the invention and methods for achieving the advantages and features will be apparent by referring to the exemplary embodiments to be described in detail with reference to the accompanying drawings. However, the invention is not limited to the exemplary embodiments disclosed hereinafter, but can be implemented in diverse forms. The matters defined in the description, such as the detailed construction and elements, are nothing but specific details provided to assist those of ordinary skill in the art in a comprehensive understanding of the invention, and the invention is only defined within the scope of the appended claims.

Where an element is described as being related to another element such as being "on" another element or "located on" a different layer or a layer, includes both a case where an element is located directly on another element or a layer and a case where an element is located on another element via another layer or still another element. In contrast, where an element is described as being is related to another element such as being "directly on" another element or "located directly on" a different layer or a layer, indicates a case where an element is located on another element or a layer with no intervening element or layer therebetween.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Throughout the specification, the same reference numerals are used for the same or similar parts.

Figure 2:
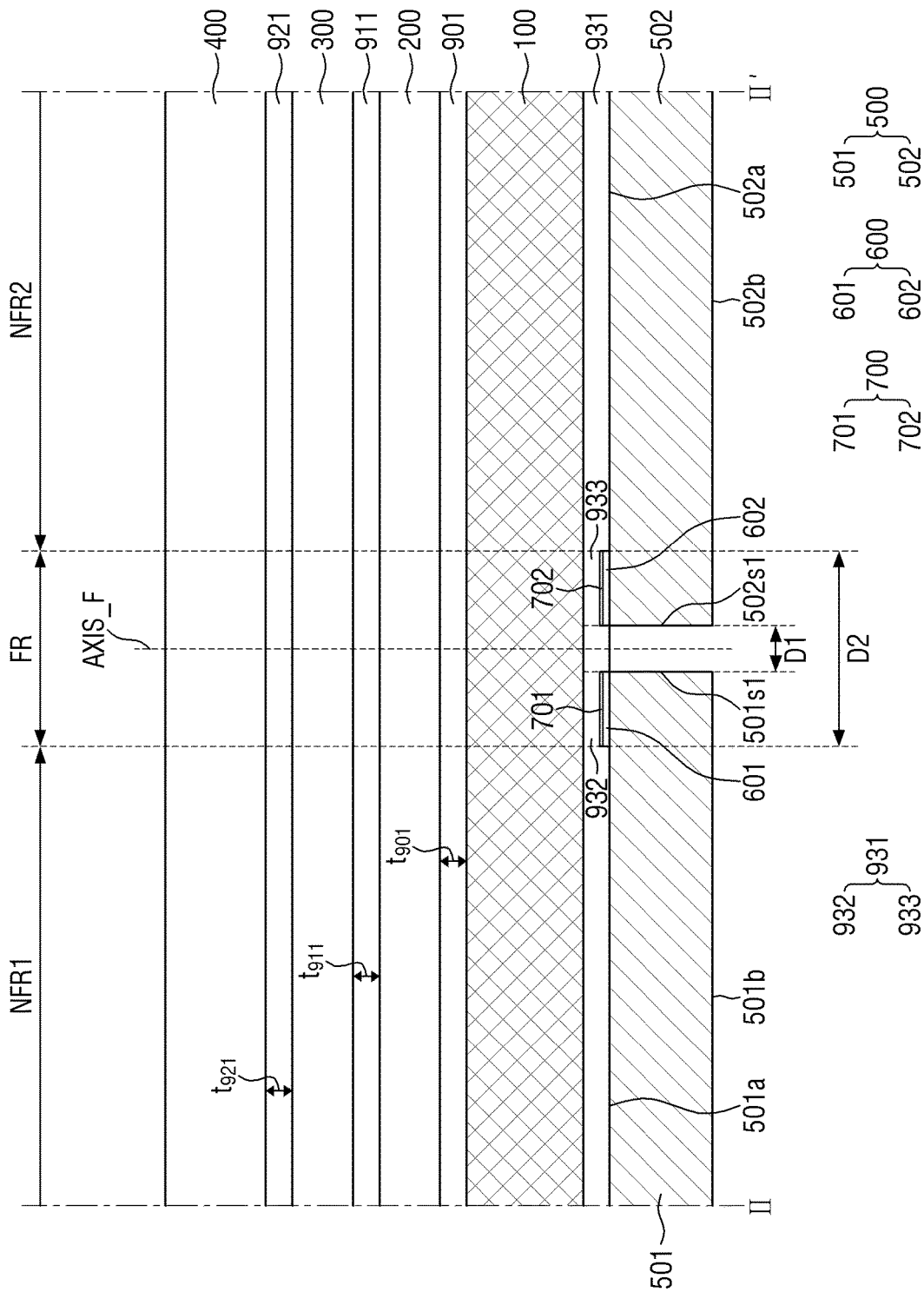
FIG. 2 is a cross-sectional view taken along line II-IF of FIG. 1.
Figure 3:
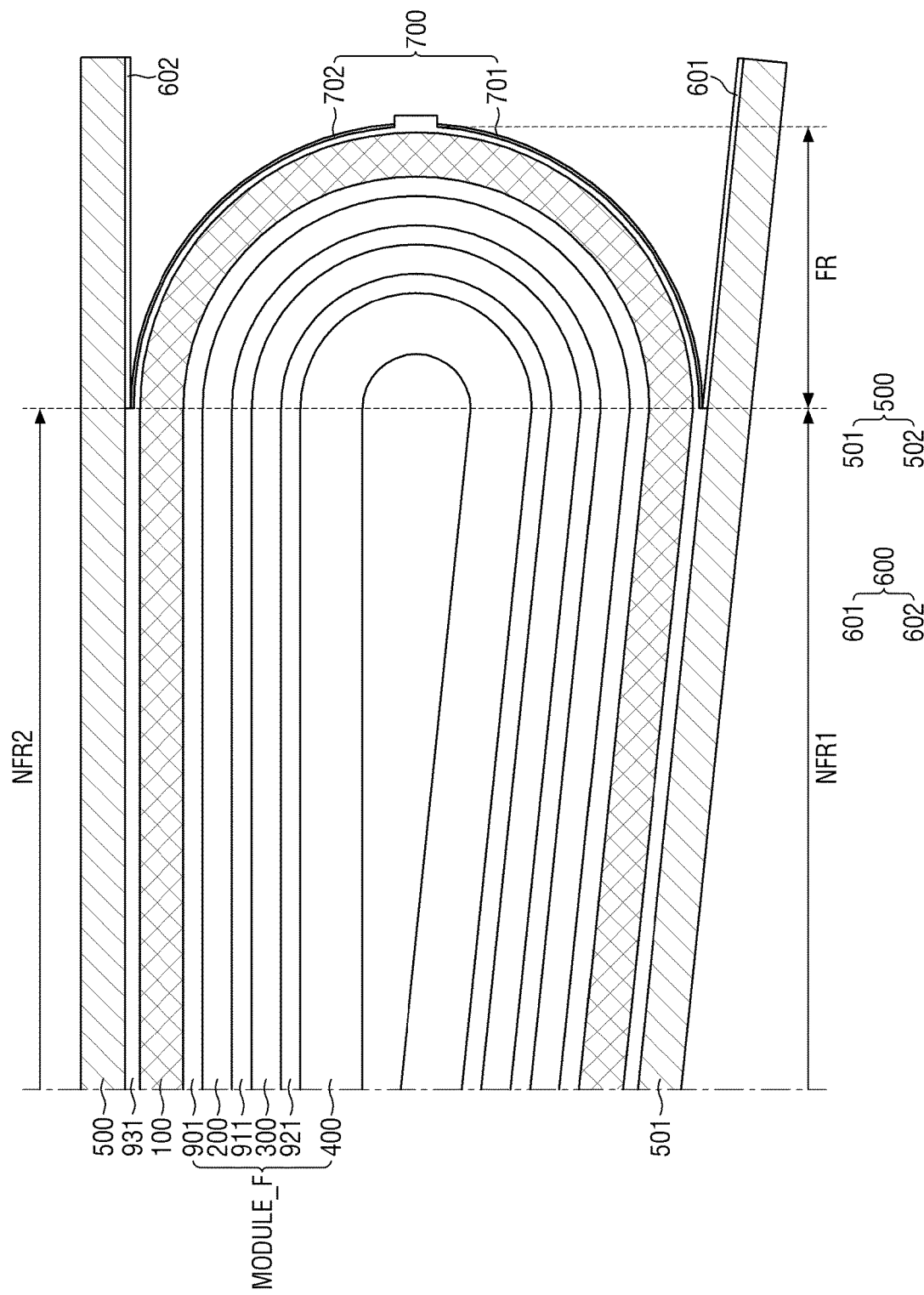
FIG. 3 is a cross-sectional view illustrating an exemplary embodiment of a folded state of the display device.
Figure 4:
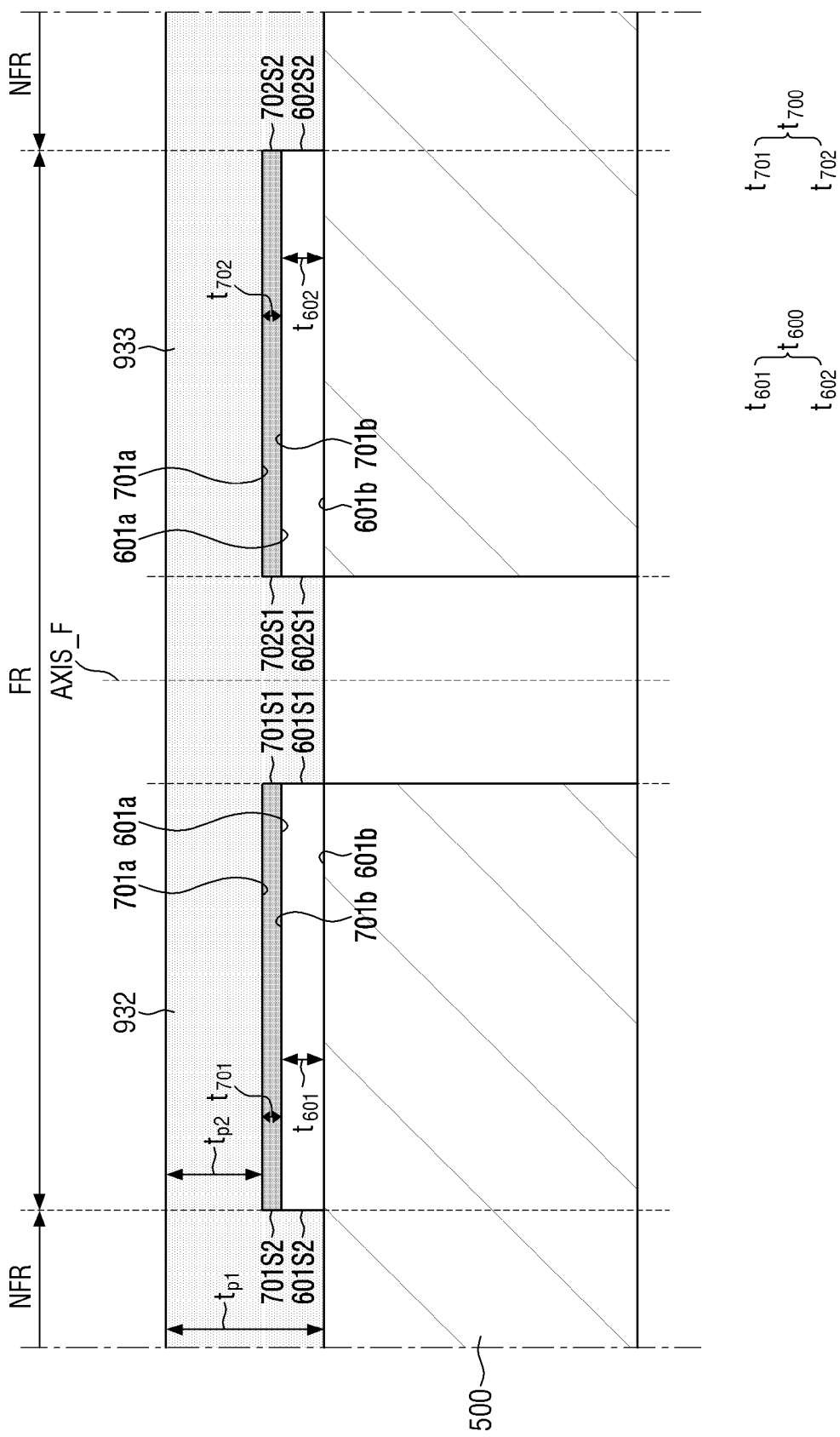
FIG. 4 is an enlarged view of an exemplary embodiment of a lower surface (alternatively, a back surface) of a flexible module of the display device.
Figure 5:
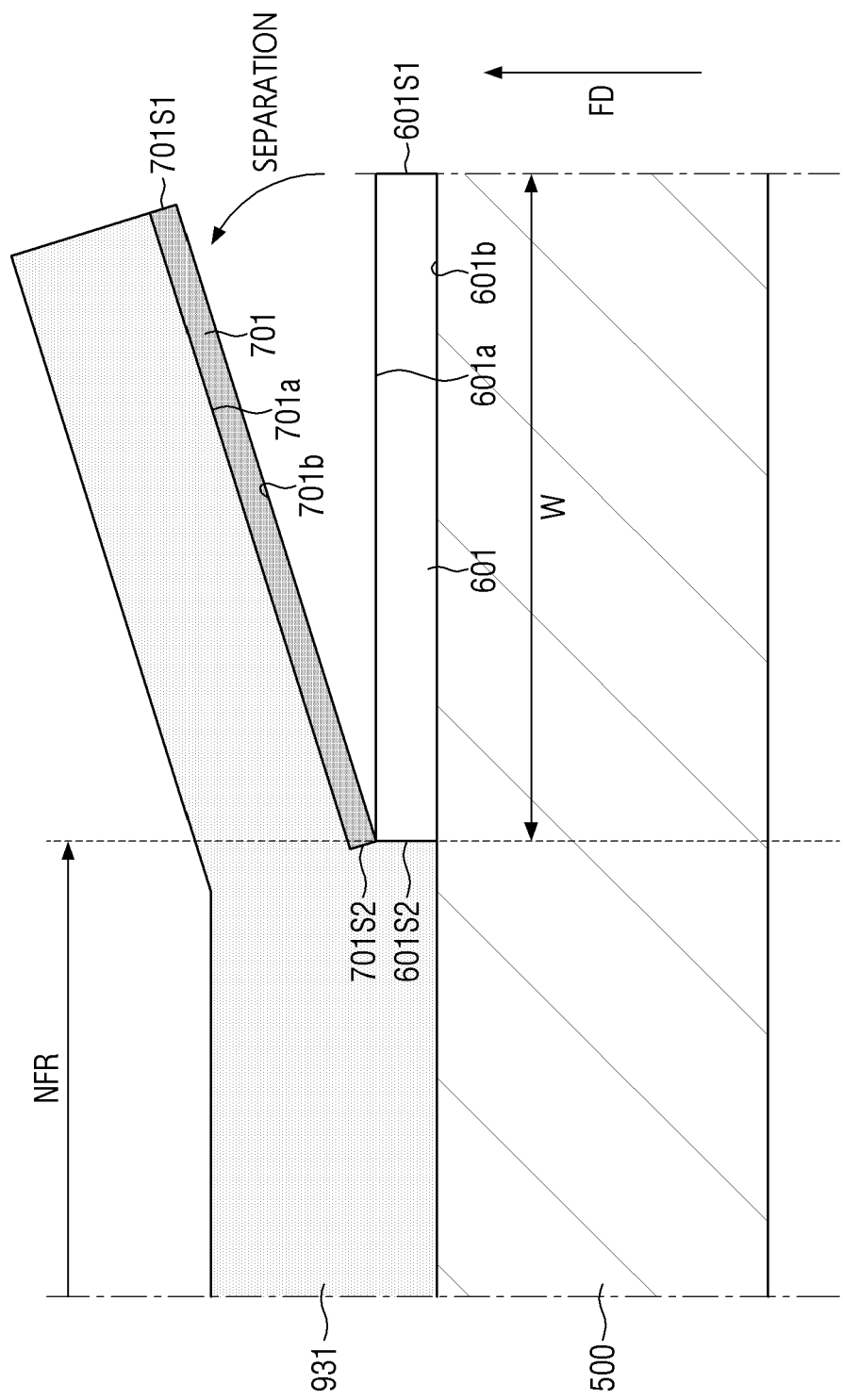
FIG. 5 is a view illustrating a folded state of FIG. 4.

FIG. 1 is a perspective view of a display device according to an exemplary embodiment. FIG. 2 is a cross-sectional view taken along line II-IF of FIG. 1. FIG. 3 is a cross-sectional view illustrating a folded state of the display device according to the exemplary embodiment, FIG. 4 is an enlarged view of a lower surface (alternatively, a back surface) of a flexible module of the display device according to the exemplary embodiment, and FIG. 5 is a view illustrating a folded state of FIG. 4.

Referring to FIGS. 1 to 5, a display device 1 may have a substantially planar rectangular shape in a plan view. The display device 1 may have a rectangular shape having vertically planar edges or a rectangular shape having rounded edges in a plan view. The display device 1 may include four sides (or edges). The display device 1 may include long-side edges LS1 and LS2 and short-side edges SS1 and SS2.

In the specification, folded (alternatively, foldable or folding) may refer to a flexible state, and specifically is a term designated by including bent (alternatively, bendable or bending) and rolled (alternatively, rollable or rolling). Furthermore, the folding should be interpreted as including both "partially" folding, "entirely" folded, "in" folding, and "out" folding.

The display device 1 may include a folding axis AXIS_F that traverses the upper and lower sides of the display device 1 in the plan view. The display device 1 may be folded based on the folding axis AXIS_F.

Referring to FIG. 2, the display device 1 may include a folding region FR (alternatively, an intermediate region) that is disposed in an intermediate region and includes a folding axis AXIS_F, and non-folding regions NFR1 and NFR2 (alternatively, a first region and a second region) disposed at left and right sides of the folding region FR, respectively. That is, the display device 1 may include the folding region FR (alternatively, the intermediate region) which is folded based on the folding axis AXIS_F and the non-folding regions NFR1 and NFR2 which are adjacent to the folding region FR and spaced apart from each other with reference to the folding region FR so as not to be folded. As described below, in the folding region FR, a flexible module MODULE_F, support plates, and an anti-adhesive coating layer may overlap with each other in a thickness direction. In the non-folding regions NFR1 and NFR2, the anti-adhesive coating layer is not disposed, and support plates 501 and 502 may be directly bonded to the flexible module MODULE_F through a fourth adhesive film 931. The detailed contents therefor will be described below.

The display device 1 may include a long side edge LS which intersects the folding axis AXIS_F based on the folding axis AXIS_F and extends from the left side to the right side (alternatively, from the right side to the left side) of the display device 1 in the plan view. In an exemplary embodiment, a long side located above the display device 1 in the plan view may be referred to as a first long side LS1, and a long side located below the display device 1 may be referred to as a second long side LS2, for example. The display device 1 may further include a short side edge SS substantially parallel to the folding axis AXIS_F and extending from the lower side to the upper side (alternatively, from the upper side to the lower side) of the display device 1 at a planar view. In an exemplary embodiment, a short side located on the left side in the plan view of the display device 1 in the plan view may be referred to as a first short side SS1, and a short side located on the right side may be referred to as a second short side SS2, for example. However, the invention is not limited thereto, and in another exemplary embodiment, an edge that intersects the folding axis AXIS_F and extends from the left side to the right side (alternatively, from the right side to the left side) of the display device 1 in the plan view may be a short side edge SS. In addition, an edge which is substantially parallel to the folding axis AXIS_F and extends from the lower side to the upper side (alternatively, from the upper side to the lower side) of the display device 1 in the plan view may be a long side edge LS.

A groove (for example, a notch) recessed downward/upward in the plan view is defined in a region adjacent to the first long side LS1 and the second long side LS2 of the display device 1 which meet the folding axis AXIS_F, and a hinge member (not illustrated) or the like for converting a state may be bonded to the recessed portion, but the invention is not limited thereto.

The display device 1 may include a flexible module MODULE_F. The flexible module MODULE_F includes a display module 200 (alternatively, a display panel), and various layers may be disposed on the upper and lower portions of the display module 200 in a cross-sectional direction. In the specification, various layers included in the flexible module MODULE_F may be referred to as members, modules, and the like. In an exemplary embodiment, the display device 1 may include a lower functional layer 100, the display module 200, an upper functional layer 300, and a window member 400.

A plurality of adhesive members (alternatively, an adhesive film, and an adhesive layer) are interposed between respective layers (alternatively, modules, and members) including the display module 200 to connect the respective layers (alternatively, modules and members).

The lower functional layer 100 may be disposed at the bottom of the display device 1. The lower functional layer 100 may be configured by a single layer performing a buffering function, a heat radiation function, an electromagnetic wave shielding function, a grounding function, an intensity reinforcing function, a supporting function, a pressure sensing function, a digitizing function, or the like or in various combinations of the layers. When the lower functional layer 100 includes a laminated structure of various functional layers, adhesive layers may be interposed between the respective functional layers, but the invention is not limited thereto. The lower functional layer 100 may include a buffer member, a supporting substrate, a heat-radiating layer, an electromagnetic wave shielding layer, a pressure sensor, a digitizer, or the like.

In an exemplary embodiment, it is illustrated that the lower functional layer 100 includes the buffer member. The buffer member may prevent the impact applied from the outside (for example, the lower direction of the buffer member) from being transmitted to the display module 200 from the bottom. In an exemplary embodiment, the buffer member may include a foam material and may include a material such as polyurethane ("PU"), thermoplastic polyurethane ("TPU"), silicon (Si), polydimethylacrylamide ("PDMA"), and the like.

The lower functional layer 100 may have lower light transmittance than a plurality of layers (alternatively, modules, and members) disposed on the upper portion of the display module 200 (alternatively, the display panel) to be described below. That is, the upper layers of the display module 200 have relatively high light transmittance and may transmit light (alternatively, an image) emitted upward from a display portion DA of the display module 200. The lower functional layer 100 has relatively low light transmittance and may block light emitted downward from the display portion DA of the display module 200.

The display module 200 (alternatively, the display panel) may be disposed on the lower functional layer 100. A first adhesive film 901 is disposed between the lower functional layer 100 and the display module 200 and the lower functional layer 100 may be attached to the lower surface of the display module 200 through the first adhesive film 901. However, the invention is not limited thereto, and in another exemplary embodiment, the first adhesive film 901 may be omitted, and the display module 200 (alternatively, the display panel) may be laminated directly on the lower functional layer 100. In an exemplary embodiment, when the first adhesive film 901 is disposed, the first adhesive film 901 is a film having adhesive characteristics on both the upper surface and the lower surface thereof, similarly to a second adhesive film 911, a third adhesive film 921 and a fourth adhesive film 931 to be described below, and may be, for example, a press sensitive adhesive ("PSA"), an optical clear adhesive ("OCA"), and an optical clear resin ("OCR"). The adhesive film may include an acrylic resin, a silicone resin, or the like. Further, in an exemplary embodiment, the adhesive film may have an elongation of about 100 percent (%) to about 1,000%.

The display module 200 may display an image by an input data signal. The display module 200 may be applied with a panel such as an organic light emitting display panel, a liquid crystal display panel, a plasma display panel, an electrophoretic display panel, an electrowetting display panel, a quantum dot light emitting display panel, and a micro light emitting diode ("LED") display panel. In the illustrated embodiment, an organic light emitting display panel is applied as the display module 200, but the invention is not limited thereto.

In an exemplary embodiment, the display module 200 may include a flexible substrate including a flexible polymer material such as polyimide ("PI") or the like. Accordingly, the display module 200 may be bent, folded, or rolled.

The display module 200 may have a shape substantially similar to a planar shape of the display device 1. However, the display module 200 is not limited thereto, and at least one side (e.g., the first short side SS1) of the display module 200 may be bent to have a curved surface or bent in a vertical direction. A circuit board (not illustrated) including wires for transmitting signals desired for driving the display module 200 is connected through at least one side of the display module 200, and the circuit board may be disposed to overlap with the display module 200 in a thickness direction.

The display module 200 may include a display portion DA (alternatively, a light emitting region) for displaying a screen and a non-display portion NA (alternatively, a non-emitting region) for not displaying the screen.

The display portion DA may be disposed at a central portion of the display module 200. The display portion DA may include a plurality of pixels PX (alternatively, electroluminescent units). Similarly to the display device 1, the display portion DA may have a rectangular shape with rounded edges in a plan view. However, the invention is not limited thereto, and in another exemplary embodiment, the display portion DA may have various shapes such as a rectangle, a square or other polygons, a circle, an ellipse, or the like.

The non-display portion NA may be located around the display portion DA. The remaining portion of the display module 200 excluding the display portion DA may be the non-display portion NA. The non-display portion NA may be a region from an outer boundary of the display portion DA to the edge of the display module 200. Signal lines or driving circuits for applying signals to the display portion DA may be disposed in the non-display portion NA. An outermost black matrix may be disposed on the non-display portion NA.

According to an exemplary embodiment, the display module 200 may include a folding region FR (alternatively, a bendable region). The folding region FR will be described below together with the support plate 500.

The pixel PX may include a light emitting layer and a circuit layer controlling the amount of light emitted from the light emitting layer. The circuit layer may include a plurality of wires, a plurality of electrodes, and at least one transistor. In an exemplary embodiment, the light emitting layer may include an organic light emitting material. The light emitting layer may be sealed by an encapsulation film. In an exemplary embodiment, the encapsulation film may seal the light emitting layer to prevent moisture and the like from flowing in from the outside. The encapsulation film may be a single inorganic film or a multilayered inorganic film or a laminated film in which inorganic films and organic films are alternately laminated.

The upper functional layer 300 may be disposed on the display module 200 (alternatively, the display panel).

A second adhesive film 911 is disposed between the display module 200 (alternatively, the display panel) and the upper functional layer 300 and the upper functional layer 300 may be attached to the upper surface of the display module 200 through the second adhesive film 911. However, the invention is not limited thereto, and in another exemplary embodiment, the second adhesive film 911 may be omitted, and the upper functional layer 300 may be laminated directly on the display module 200.

The upper functional layer 300 may include at least one functional layer. The functional layer may be a layer that performs a touch sensing function, a color filtering function, a color conversion function, a polarization function, a biometric information recognition function (for example, a fingerprint recognition function), and the like. The functional layer may be a sheet layer including a sheet, a film layer including a film, a thin film layer, a coating layer, a panel, a plate and the like. One functional layer may include a single layer, but may also include a plurality of laminated thin films or coating layers. In an exemplary embodiment, the functional layer may be a touch sensing panel, a color filter, an optical film, a fingerprint sensing panel, or the like, for example.

In an exemplary embodiment, the upper functional layer 300 may include an optical film such as a microlens or a prism film. In another exemplary embodiment, the optical film may be omitted.

The window member 400 may be disposed on the upper functional layer 300.

A third adhesive film 921 is disposed between the upper functional layer 300 and the window member 400, and the window member 400 may be attached to the upper surface of the upper functional layer 300 through the third adhesive film 921. However, the invention is not limited thereto, and in another exemplary embodiment, the third adhesive film 921 may be omitted, and the window member 400 may be laminated directly on the upper functional layer 300.

The window member 400 serves to cover and protect the display module 200 (alternatively, the display panel). In an exemplary embodiment, the window member 400 may include glass, quartz, or the like. In an exemplary embodiment, the thickness of the window member 400 may be less than about 100 micrometers ($\mu$m), for example. When the thickness of the window member 400 is small, the stress (folding or bending resistance) at the time of folding (or bending) is reduced, and the structure of the window member 400 may be slightly modified even when the folded state and the unfolded state are repeated. In the illustrated embodiment, the window member 400 may include ultra thin glass ("UTG"), for example.

The display device 1 may further include a support plate 500, an anti-adhesive layer 600, and an adhesive protection layer 700 below the lower functional layer 100. The support plate 500 may prevent the display module 200 from being bent by an external force or alleviate (or reduce) the degree of bending (e.g., a bending angle, and a bending radius of curvature) of the display module 200. That is, the support plate 500 may maintain the display module 200 in a relatively flat state even when an external force is applied.

The support plate 500 may include a rigid or semi-rigid material. In an exemplary embodiment, the support plate 500 may include a metal material such as stainless steel ("SUS") and aluminum or a polymer such as polymethyl methacrylate ("PMMA"), polycarbonate ("PC"), polyvinyl alcohol ("PVA"), acrylonitrile-butadiene-styrene ("ABS"), polyethylene terephthalate ("PET"), and the like. In an exemplary embodiment, the support plate 500 may be a stainless steel film having a thickness of about 150 $\mu$m to about 200 $\mu$m, for example. As another example, the support plate 500 may be an aluminum film having a thickness of about 150 $\mu$m to about 200 $\mu$m, for example.

The support plate 500 includes a first support plate 501 (alternatively, a first portion) and a second support plate 502 (alternatively, a second portion) that are separated (alternatively, spaced apart) from each other to the left and right sides (alternatively, a horizontal direction). The first support plate 501 and the second support plate 502 may include upper, lower and side surfaces 501a, 501b and 501s1 (inner side surface), 501s2, 502a, 502b, 502s1 (inner side surface), and 502s2. The thicknesses and the widths of the first support plate 501 and the second support plate 502 may be the same as each other, but are not limited thereto.

The first support plate 501 and the second support plate 502 may be spaced apart from each other by a first separation distance D1 with respect to the folding axis AXIS_F. Specifically, the inner side surface 501s1 of the first support plate 501 and the inner side surface 502s1 of the second support plate 502 may be spaced apart from each other by the first separation distance D1. In an exemplary embodiment, the first separation distance D1 may be equal to or less than about 50 μm, for example. The first and second support plates 501 and 502 are mutually symmetric to each other with respect to the folding axis AXIS_F, but are not limited thereto.

In FIG. 2, the first support plate 501 and the second support plate 502 are spaced apart from each other, but it is an example for clarifying that the first support plate 501 and the second support plate 502 are separated from each other (alternatively, mutually discontinuous), but the invention is not limited thereto. In another exemplary embodiment, the inner side surface 501s1 of the first support plate may be in contact with at least a portion of the inner side surface 502s1 of the second support plate, for example.

Although not illustrated, protrusions or grooves are provided on the lower surfaces 501a and 502a of the support plate, and a housing (not illustrated) supporting the elements of the display device 1 may be further disposed. The housing further disposed on the lower surface of the support plate may be bonded (or arranged) to the support plate through the protrusion or groove.

The anti-adhesive layer 600 may be disposed (or bonded) to a region where the support plate 500 and the folding region FR overlap with each other. The anti-adhesive layer 600 may be surface-treated to improve a peeling property with an adhesive film (for example, PSA, OCA, and OCR). The surface treatment is not limited, but may include peeling treatment such as olefin treatment, silicone-based treatment, long chain alkyl-based treatment, and fluorine-based treatment, for example. With the surface treatment, the surface of the support plate (alternatively, the anti-adhesive layer 600) may include olefin, silicone, long-chain alkyl, or fluorine-based molecules, for example, thereby decreasing adhesion to the adhesive film. In addition, surface treatment substantially the same as or similar to anti-fingerprint treatment may be further used. In the case where the adhesive film (for example, the fourth adhesive film 931) is an acrylic adhesive, the adhesive film may include silicon, and in the case of a silicone adhesive, the adhesive film may include acryl.

In an exemplary embodiment, a thickness $t_{600}$ of the anti-adhesive layer 600 in the thickness direction may be about 10 nanometers (nm) to about 20 nm, for example. In the illustrated exemplary embodiment, a thickness $t_{601}$ of the first anti-adhesive layer 601 and a thickness $t_{602}$ of the second anti-adhesive layer 602 may be substantially the same with each other as the thickness $t_{600}$, but the invention is not limited thereto, and in another exemplary embodiment, the thickness $t_{601}$ and the thickness $t_{602}$ may be different from each other.

The anti-adhesive layer 600 may include a first anti-adhesive layer 601 disposed on the first support plate 501 and a second anti-adhesive layer 602 disposed on the second support plate 502. The first anti-adhesive layer 601 and the second anti-adhesive layer 602 may be spaced apart from each other by a first separation distance D1 to the left and right sides.

The first anti-adhesive layer 601 and the second anti-adhesive layer 602 may include upper, lower and side surfaces 601a, 601b, 601s1 (inner side surface), 601s2 (outer side surface), 602a, 602b, 602s1 (inner side surface), and 602s2 (outer side surface). The inner side surfaces 601s1 and 602s1 of the first anti-adhesive layer and the second anti-adhesive layer are aligned (alternatively, matched or overlapped) with the inner side surface 501s1 of the first support plate 501 and the inner side surface 502s1 of the second support plate 502 in the thickness direction, respectively.

However, of course, the invention is not limited thereto, and in another exemplary embodiment, the inner side surfaces 601s1 and 602s1 of the first and second anti-adhesive layers 601 and 602 are disposed to extend outside the inner side surface 501s1 of the first support plate 501 and the inner side surface 502s1 of the second support plate 502 or disposed to penetrate to the inside thereof.

Further, the outer side surfaces 601s2 and 602s2 of the first and second anti-adhesive layers 601 and 602 may be overlapped (alternatively, matched or aligned) with the boundary of the folding region FR, respectively. That is, the region up to the outer side surface 601s2 of the first anti-adhesive layer 601 and the outer side surface 602s2 of the second anti-adhesive layer 602 may be defined as the folding region FR. In an exemplary embodiment, the width of the folding region FR may be the same as a second separation distance D2 between the outer side surfaces 601s2 and 602s2 of the first and second anti-adhesive layers 601 and 602. The first separation distance D1 may be smaller than the second separation distance D2.

The adhesive protection layer 700 may be disposed on the anti-adhesive layer 600. As illustrated in FIG. 3, when the display device 1 is in a folded state, a foreign substance or the like between the fourth adhesive film 931 and the housing (not illustrated) adheres to the fourth adhesive film 931 and thus the adhesive protection layer 700 may prevent internal modification of the display device 1 from occurring. Further, the adhesive protection layer 700 supports the fourth adhesive film 931 to prevent aggregation inside the fourth adhesive film 931 by a self-cohesive force (or an adhesive force) of the fourth adhesive film 931.

The adhesive protection layer 700 may be deposited (e.g., vapor-deposited) on the anti-adhesive layer 600. The adhesive protection layer 700 may be bonded (alternatively, adhered) to the adhesive preventive layer 600 at a predetermined bonding force (alternatively, an adhesive force) at the interface between the adhesive protection layer 700 and the anti-adhesive layer 600. In this case, the adhesive protection layer 700 may be bonded (alternatively, adhered) over the entire region of the interface with the anti-adhesive layer 600. However, the invention is not limited thereto, and in another exemplary embodiment, the adhesive protection layer 700 may be bonded to only a partial region of the interface. In this case, as described below, since the bonding force (alternatively, the adhesive force) with the anti-adhesive layer 600 is smaller than the bonding force (alternatively, the adhesive force) with the fourth adhesive film 931, when the adhesive protection layer 700 is folded (alternatively, bent), the adhesive protection layer 700 may be separated (alternatively, isolated or spaced apart) from the anti-adhesive layer 600. However, the bonding force (alternatively, the adhesive force) between the adhesive protection layer 700 and the anti-adhesive layer 600 while the display device 1 is in the unfolded state again may be smaller than the bonding force (alternatively, the adhesive force) between the adhesive protection layer 700 and the anti-adhesive layer 600 while the display device 1 is in a previously unfolded state, but the invention is not limited thereto, and in another exemplary embodiment, the same bonding force (alternatively, the adhesive force) may be maintained.

The adhesive protection layer 700 may be an inorganic material. In an exemplary embodiment, the adhesive protection layer 700 may include silicon dioxide ($SiO_2$). Specifically, unlike the anti-adhesive layer 600, the adhesive protection layer 700 may not include an anti-adhesive group (for example, olefin, silicon, long-chain alkyl, and fluorine-based molecules), for example.

In an exemplary embodiment, a thickness $t_{700}$ of the adhesive protection layer in the thickness direction may be about 1 nm to about 2 nm, for example. In the illustrated exemplary embodiment, a thickness $t_{701}$ of the first adhesive protection layer 701 and a thickness $t_{702}$ of the second adhesive protection layer 702 may be substantially the same with each other as the thickness $t_{700}$, but the invention is not limited thereto, and in another exemplary embodiment, the thickness $t_{701}$ and the thickness $t_{702}$ may be different from each other.

That is, the thickness $t_{600}/t_{601}/t_{602}$ of the anti-adhesive layer 600 may be about 5 to 20 times larger than the thickness $t_{700}/t_{701}/t_{702}$ of the adhesive protection layer 700 in the thickness direction, for example.

The adhesive protection layer 700 may include a first adhesive protection layer 701 disposed on the first support plate 501 and a second adhesive protection layer 702 disposed on the second support plate 502. The first adhesive protection layer 701 may be overlapped with the first anti-adhesive layer 601 and the first support plate 501 in the thickness direction. The second adhesive protection layer 702 may be overlapped with the second anti-adhesive layer 602 and the second support plate 502 in the thickness direction.

The first adhesive protection layer 701 and the second adhesive protection layer 702 may include upper, lower and side surfaces 701a, 701b, 701s1 (inner side surface), 701s2 (outer side surface), 702a, 702b, 702s1 (inner side surface), and 702s2 (outer side surface). The first adhesive protection layer 701 and the second adhesive protection layer 702 may be spaced apart from each other by a first separation distance D1 to the left and right sides. Specifically, the inner side surface 701s1 of the first adhesive protection layer 701 and the inner side surface 702s1 of the second adhesive protection layer may be spaced apart from each other by the first separation distance D1. The inner side surfaces 701s1 and 702s1 of the first adhesive protection layer 701 and the second adhesive protection layer 702 may be aligned (alternatively, matched or overlapped) with the inner side surface 501s1 of the first support plate 501 and the inner side surface 502s1 of the second support plate 502 in the thickness direction, respectively. In addition, the outer side surfaces 701s2 and 702s2 of the first adhesive protection layer 701 and the second adhesive protection layer 702 may be overlapped (alternatively, matched or aligned) with the outer side surfaces 601s2 and 602s2 of the first anti-adhesive layer 601 and the second anti-adhesive layer 602 in the thickness direction, and may be overlapped (alternatively, matched or aligned) with the boundary of the folding region FR, respectively. However, the invention is not limited thereto, and in another exemplary embodiment, the inner side surfaces 701s1 and 702s1 of the first adhesive protection layer 701 and the second adhesive protection layer 702 may be disposed to extend outside the inner side 601s1 and 602s1 of the first anti-adhesive layer 601 and the second anti-adhesive layer 602 or disposed to penetrate to the inside thereof.

A fourth adhesive film 931 is disposed between the support plate 500 and the lower functional layer 100, and the support plate 500 may be attached to the lower functional layer 100 through the fourth adhesive film 931. The fourth adhesive film 931 may be disposed throughout the folding region FR (alternatively, the intermediate region) of the display device 1 and the first and second non-folding regions NFR1 and NFR2 (alternatively, the first region and the second region) spaced apart from each other with reference to the folding region FR. The fourth adhesive film 931 may be unitary and disposed over the entire region (including the folding region FR and the non-folding regions NFR1 and NFR2) of the display device 1.

In an exemplary embodiment, a thickness $t_{p1}$ of the fourth adhesive film 931 in the thickness direction may be about 20 μm, for example. The thickness $t_{p1}$ of the fourth adhesive film 931 may be larger than a sum of a thickness $t_{600}/t_{601}/t_{602}$ of the anti-adhesive layer 600 and the thickness $t_{700}/t_{701}/t_{702}$ of the adhesive protection layer 700. The thickness $t_{p1}$ of the fourth adhesive film 931 may be smaller than the thickness $t_{901}/t_{911}/t_{921}$ of the first adhesive film 901/second adhesive film 911/third adhesive film 921. However, the invention is not limited thereto, and in another exemplary embodiment, the thickness $t_{p1}$ of the fourth adhesive film 931 may be substantially the same as the thickness $t_{901}/t_{911}/t_{921}$ of the first adhesive film 901/second adhesive film 911/third adhesive film 921.

Specifically, the fourth adhesive film 931 is unitary in the folding region FR of the display device 1, and may include a first overlapping region 932 which overlaps with the first support plate 501, the first anti-adhesive layer 601, and the first adhesive protection layer 701 in the thickness direction. In addition, the fourth adhesive film 931 may include a second overlapping region 933 which overlaps with the second support plate 502, the second anti-adhesive layer 602, and the second adhesive protection layer 702 in the thickness direction.

In the first overlapping region 932, the adhesive force with the fourth adhesive film 931 of the first adhesive protection layer 701 may be larger than the adhesive force with the first anti-adhesive layer 601. The adhesive force with the first anti-adhesive layer 601 of the first adhesive protection layer 701 may be smaller than the adhesive force with the fourth adhesive film 931. Similarly, in the second overlapping region 933, the adhesive force with the fourth adhesive film 931 of the second adhesive protection layer 702 may be larger than the adhesive force with the second anti-adhesive layer 602. The adhesive force with the second anti-adhesive layer 602 of the second adhesive protection layer 702 may be smaller than the adhesive force with the fourth adhesive film 931.

Accordingly, in the folded state, in the first overlapping region 932, since the adhesive force with the fourth adhesive film 931 is larger than the adhesive force with the first anti-adhesive layer 601, the first adhesive protection layer 701 may be spaced apart (alternatively, separated or isolated) from the first anti-adhesive layer 601 and the first support plate 501. As a result, as illustrated in FIG. 3, the flexible module MODULE_F may be spaced apart (alternatively, separated or isolated) from the first support plate 501 in the folding region FR. Similarly, in the folded state, in the second overlapping region 933, since the adhesive force with the fourth adhesive film 931 is larger than the adhesive force with the second anti-adhesive layer 602, the second adhesive protection layer 702 may be spaced apart (alternatively, separated or isolated) from the second anti-adhesive layer 602 and the second support plate 502. As a result, as illustrated in FIG. 3, the flexible module MODULE_F may be spaced apart (alternatively, separated or isolated) from the second support plate 502 in the folding region FR.

In the non-folding regions NFR1 and NFR2 of the display device 1, the fourth adhesive film 931 is unitary and interposed between the support plate 500 and the flexible module MODULE_F to be overlapped with the support plate 500 and the flexible module MODULE_F, and may bond (alternatively, adhere) the support plate 500 and the flexible module MODULE_F. That is, in the non-folding regions NFR1 and NFR2, in the folded state, as illustrated in FIG. 3, the flexible module MODULE_F may be bonded (alternatively, adhered) with the first support plate 501 and the second support plate 502.

The non-folding regions NFR1 and NFR2 may be regions having a smaller folding (or bending) degree by an external force than that of the folding region FR and having a substantially flat state.

Specifically, the folding region FR may have a large bending degree by the external force. In an exemplary embodiment, with respect to the same external force, the degree of modification (for example, a bending angle) of the folding region FR may be three times larger than the degree of modification of the first and second unfolding regions NFR1 and NFR2, for example. The folding region FR may be converted from the folded state to the unfolded state or from the unfolded state to the folded state by the external force.

As illustrated in FIG. 3, when the external force is applied to one side (for example, a right side) of the display device 1 upwardly (alternatively, along a folding direction FD shown in FIG. 5), the folding region FR is bent or folded, and the second unfolded region NFR2 may be overlapped or opposed with the first unfolding region NFR1 while moving or rotating along the folding direction FD. Specifically, in the first folding region NFR1 and the second folding region NFR2, as described above, the first support plate 501 and the second support plate 502 may be bonded with the flexible module MODULE_F through the fourth adhesive film 931, respectively. On the contrary, in the folding region, the first support plate 501 and the second support plate 502 may be separated (alternatively, spaced apart or isolated) from the flexible module MODULE_F. As described above, the first and second unfolding regions NFR1 and NFR2 may also be bent, but the degree of modification (for example, the bending angle) in the first and second unfolding regions NFR1 and NFR2 may be ⅓ time smaller than the degree of modification of the folding region FR.

In the folding region FR, the adhesive protection layer 700 and a part of the fourth adhesive film 931 that does not overlap with the support plate 500 may be exposed to the outside (for example, a housing (not illustrated)). In the partial region of the fourth adhesive film 931 that does not overlap with the support plate 500, the fourth adhesive film 931 may protrude from the adhesive protection layer 700 bonded to the fourth adhesive film 931 by a predetermined thickness. In an exemplary embodiment, the protruding thickness may be the same as the thickness $t_{600}/t_{601}/t_{602}$ of the anti-adhesive layer 600, for example. However, the invention is not limited thereto, and in another exemplary embodiment, in the partial region of the fourth adhesive film 931 that does not overlap with the support plate 500, the fourth adhesive film 931 may have the same thickness as the adjacent fourth adhesive film 931.

Hereinafter, referring to FIGS. 4 and 5, the thickness and the alignment (alternatively, arrangement) of the lower structure (the fourth adhesive film 931, the adhesive protection layer 700, the anti-adhesive layer 600, and the support plate 500) of the flexible module MODULE_F will be described in detail.

As described above, the thickness $t_{700}/t_{701}/t_{702}$ of the adhesive protection layer 700 may be 5 to 20 times smaller than the thickness $t_{600}/t_{601}/t_{602}$ of the anti-adhesive layer 600, for example. The adhesive protection layer 700 serves to lower the adhesive force of the fourth adhesive film 931 to the support plate 500 by contacting the fourth adhesive film 931, and it is difficult to make the display device 1 thin if the adhesive protection layer 700 has a large thickness which increases the entire thickness of the display device 1, and thus it is preferable that the thickness is 5 to 20 times smaller than the thickness $t_{600}/t_{601}/t_{602}$ of the anti-adhesive layer 600.

The thickness to of the fourth adhesive film 931 may be larger than the sum of a thickness $t_{700}/t_{701}/t_{702}$ of the adhesive protection layer 700 and the thickness $t_{600}/t_{601}/t_{602}$ of the anti-adhesive layer 600. Further, the thickness of the fourth adhesive film 931 in a region overlapping with the folding region FR may be smaller than the thickness of the fourth adhesive film 931 in the non-folding regions NFR1 and NFR2. In an exemplary embodiment, the thickness to of the fourth adhesive film 931 in the non-folding regions NFR1 and NFR2 may be substantially the same as the sum of the thickness $t_{p2}$ of the fourth adhesive film 931 in the folding region FR, a thickness $t_{700}/t_{701}/t_{702}$ of the adhesive protection layer 700, and the thickness $t_{600}/t_{601}/t_{602}$ of the anti-adhesive layer 600.

Further, as illustrated in the drawing, the inner side surfaces 701s1 and 702s1 of the adhesive protection layer 700 are aligned (alternatively, overlapped or matched) with the inner side surfaces 501s1 and 502s1 of the support plate and the inner side surfaces 600s1, 601s1 and 602s2 of the anti-adhesive layer 600 in the thickness direction. The outer side surfaces 701s2 and 702s2 of the adhesive protection layer 700 may be aligned (alternatively, overlapped or matched) with the interface between the outer surfaces 601s2 and 602s2 of the anti-adhesive layer 600 and the folding axis AXIS_F. However, the invention is not limited thereto, and in another exemplary embodiment, the inner side surfaces 701s1 and 702s1 of the adhesive protection layer 700 may be recessed inwardly from the inner side surfaces 501s1 and 502s1 of the support plate at the planar view, and the inner side surface of the anti-adhesive layer 600 may also be recessed inwardly from the inner side surface of the support plate.

In the display device 1 according to the exemplary embodiment, an adhesive film (for example, the fourth adhesive film 931) may be disposed throughout the folding region FR and the non-folding regions NFR1 and NFR2 to adhere the support plate 500 and the flexible module MODULE_F integrally on the support plate 500. In this case, as described above, the anti-adhesive layer 600 is disposed on the upper surfaces 501a and 502a overlapping with the folding region FR of the support plate and simply, the adhesive film (for example, the fourth adhesive film 931) is attached onto the support plate 500, thereby manufacturing the display device 1. That is, in order to form a non-attachment region corresponding to the folding region FR, a process of aligning to install a separate member (for example, a separate step compensation member disposed in the folding region FR by forming the adhesive film only in the non-folding regions NFR1 and NFR2) is not desired, and thus, it is possible to simplify the manufacturing process and prevent the occurrence of defects due to alignment errors or the like.

Further, when the display device 1 is in the folded state, the foreign substances between the adhesive film (for example, the fourth adhesive film 931) adhering the support plate 500 and the flexible module MODULE_F and the housing (not illustrated) are adhered to the adhesive film (for example, the fourth adhesive film 931) to prevent the internal modification of the display device 1 from occurring.

Further, the adhesive protection layer 700 supports the adhesive film (for example, the fourth adhesive film 931) to prevent aggregation inside the adhesive film (for example, the fourth adhesive film 931) by a self-cohesive force (alternatively, an adhesive force) of the adhesive film (for example, the fourth adhesive film 931).

Hereinafter, other exemplary embodiments will be described. In the following embodiments, the same components as those of the previously described embodiments will be referred to as the same reference numerals, and the description thereof will be omitted or simplified.

Figure 6:
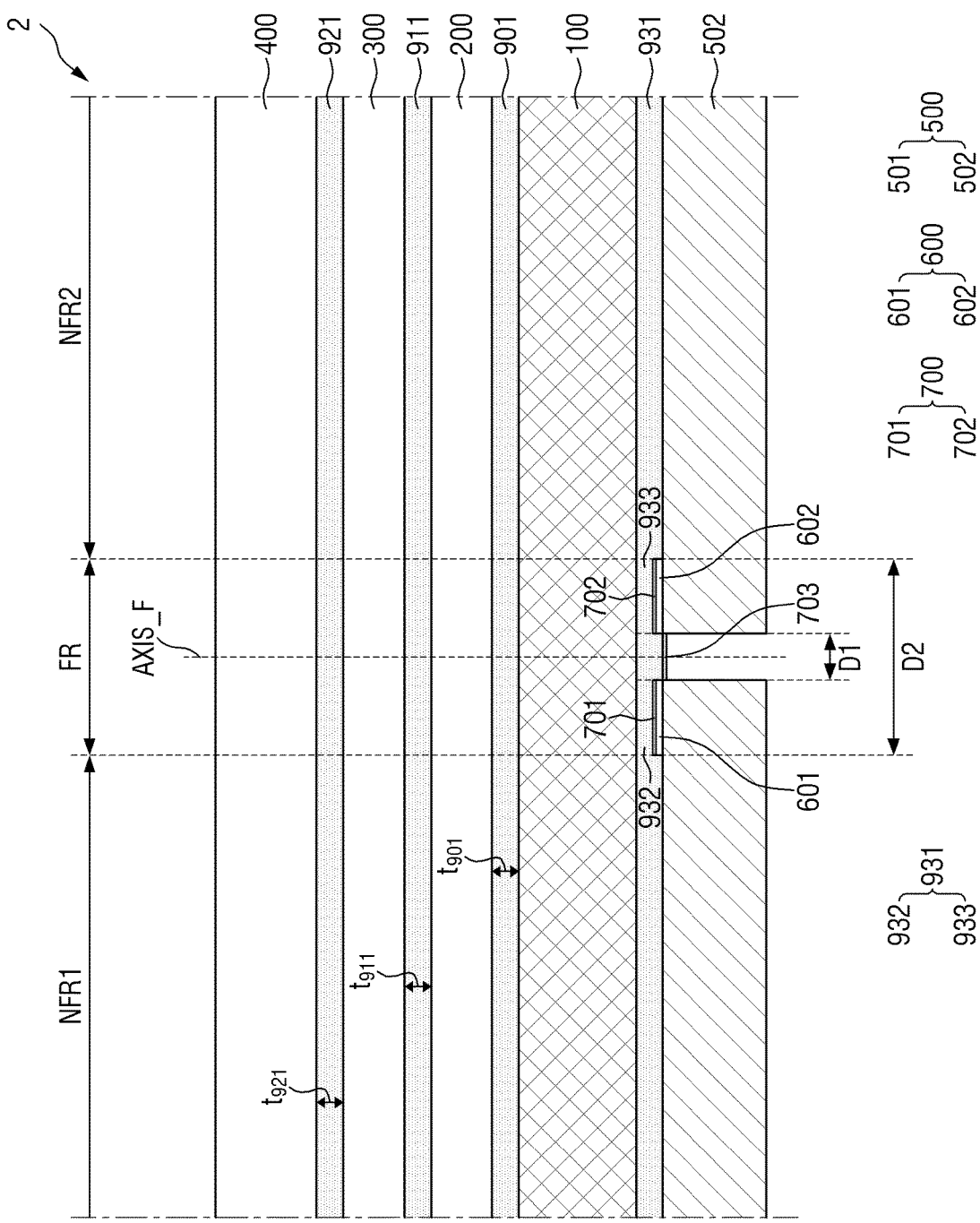
FIGS. 6 and 7 are cross-sectional views of another exemplary embodiment of a display device and a folded state thereof, respectively.
Figure 7:
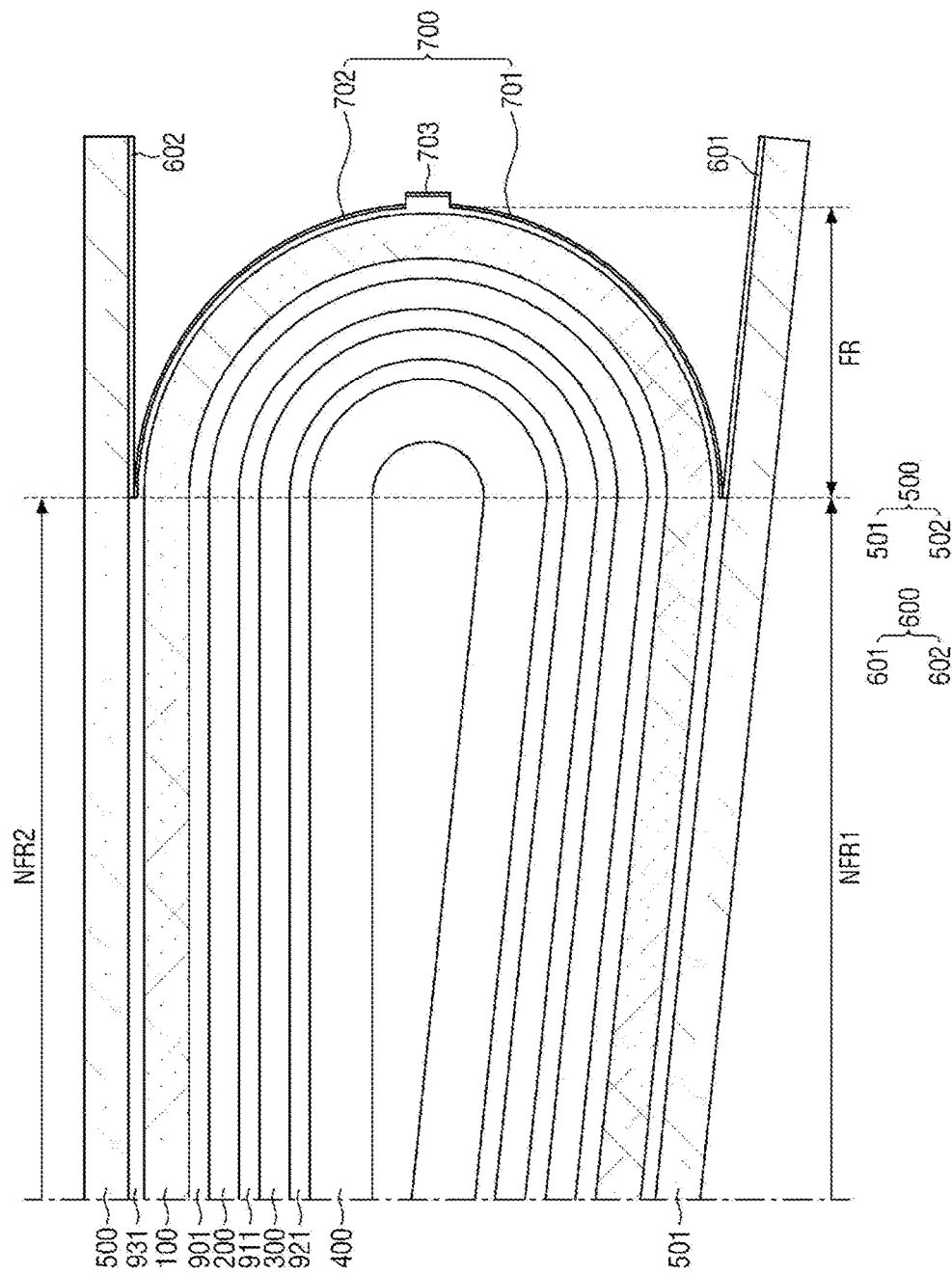

FIGS. 6 and 7 are cross-sectional views of a display device according to another exemplary embodiment and a folded state thereof, respectively.

Referring to FIGS. 6 and 7, there is a difference from the exemplary embodiments of FIGS. 1 to 5 in that a display device 2 according to the illustrated exemplary embodiment further includes an adhesive protection layer 703 on the lower surface of the fourth adhesive film 931 corresponding to a region except for the first overlapping region 932 and the second overlapping region 933 of the folding region FR.

More specifically, as described above, in the folding region FR, the adhesive protection layer 700 and a part of the fourth adhesive film 931 that does not overlap with the support plate 500 may be exposed to the outside (for example, a housing (not illustrated)). In the partial region of the fourth adhesive film 931 that does not overlap with the support plate 500, the fourth adhesive film 931 may protrude from the adhesive protection layer 700 bonded to the fourth adhesive film 931 by a predetermined thickness. In an exemplary embodiment, the protruding thickness may be equal to the thickness $t_{600}/t_{601}/t_{602}$ of the anti-adhesive layer 600, for example.

In this case, the adhesive protection layer 703 may be further disposed on the exposed upper surface of the fourth adhesive film 931 to protect the exposed region of the fourth adhesive film 931. In FIG. 3, it is illustrated that the adhesive protection layer 703 is disposed only on the upper surface of the exposed region of the fourth adhesive film 931, but the invention is not limited thereto, and in another exemplary embodiment as illustrated in FIG. 4, the adhesive protection layer 703 may also be disposed to surround the exposed region.

Even in the illustrated exemplary embodiment, in the display device 2, an adhesive film (for example, the fourth adhesive film 931) may be disposed throughout the folding region FR and the non-folding regions NFR1 and NFR2 to adhere the support plate 500 and the flexible module MODULE_F integrally on the support plate 500. In this case, as described above, the anti-adhesive layer 600 is disposed on the upper surfaces 501a and 502a overlapping with the folding region FR of the support plate and simply, the adhesive film (for example, the fourth adhesive film 931) is attached onto the support plate 500, thereby manufacturing the display device 2. That is, in order to form a non-attachment region corresponding to the folding region FR, a process of aligning to install a separate member (for example, a separate step compensation member disposed in the folding region FR by forming the adhesive film only in the non-folding regions NFR1 and NFR2) is not desired, and thus, it is possible to simplify the manufacturing process and prevent the occurrence of defects due to alignment errors or the like.

Further, when the display device 2 is in the folded state, the foreign substances between the adhesive film (for example, the fourth adhesive film 931) adhering the support plate 500 and the flexible module MODULE_F and the housing (not illustrated) are adhered to the adhesive film (for example, the fourth adhesive film 931) to prevent the internal modification of the display device 2 from occurring.

Further, the adhesive protection layer 700 supports the adhesive film (for example, the fourth adhesive film 931) to prevent aggregation inside the adhesive film (for example, the fourth adhesive film 931) by a self-cohesive force (alternatively, an adhesive force) of the adhesive film (for example, the fourth adhesive film 931).

Figure 8:
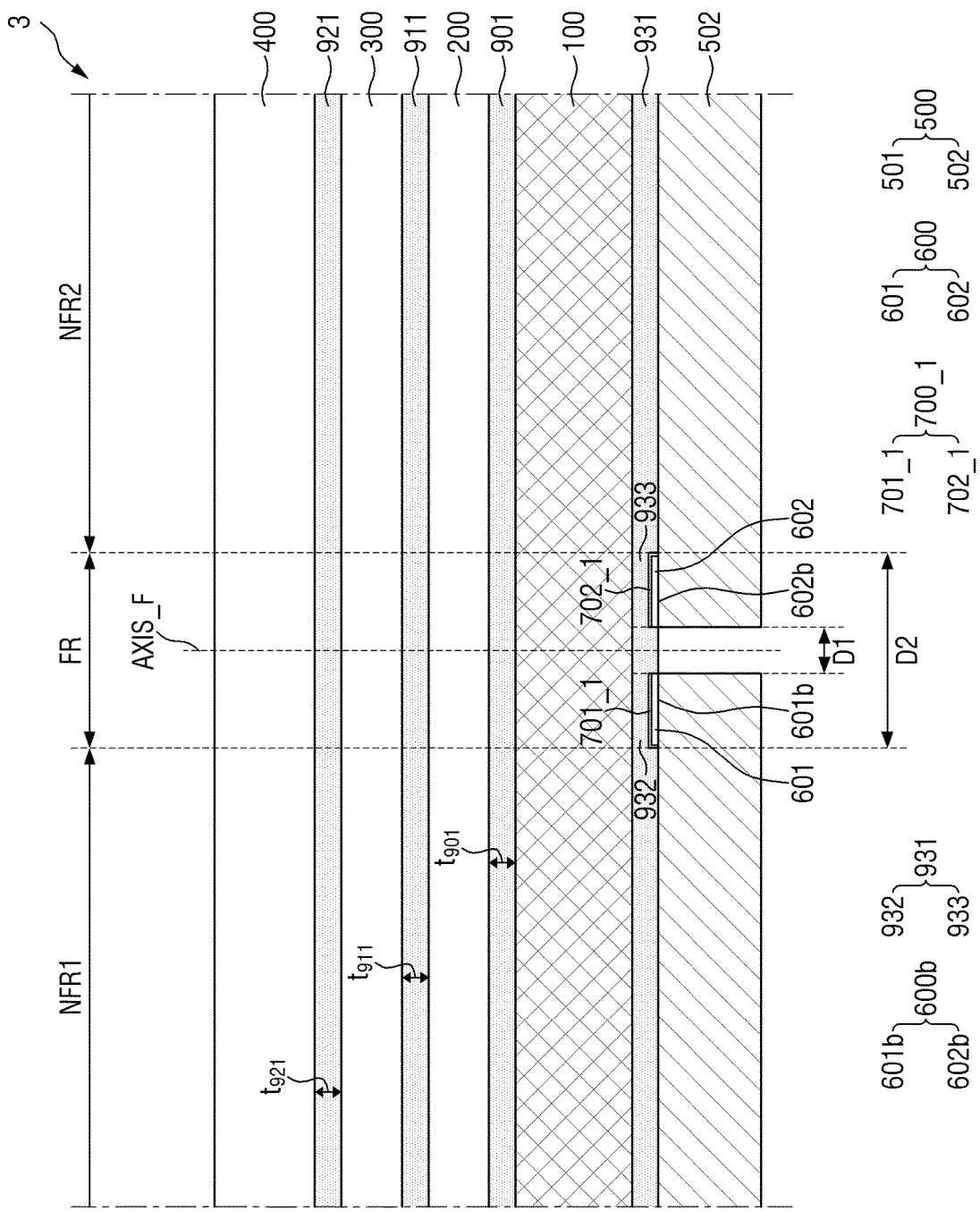
FIGS. 8 and 9 are cross-sectional views of another exemplary embodiment of a display device and a folded state thereof, respectively.
Figure 9:
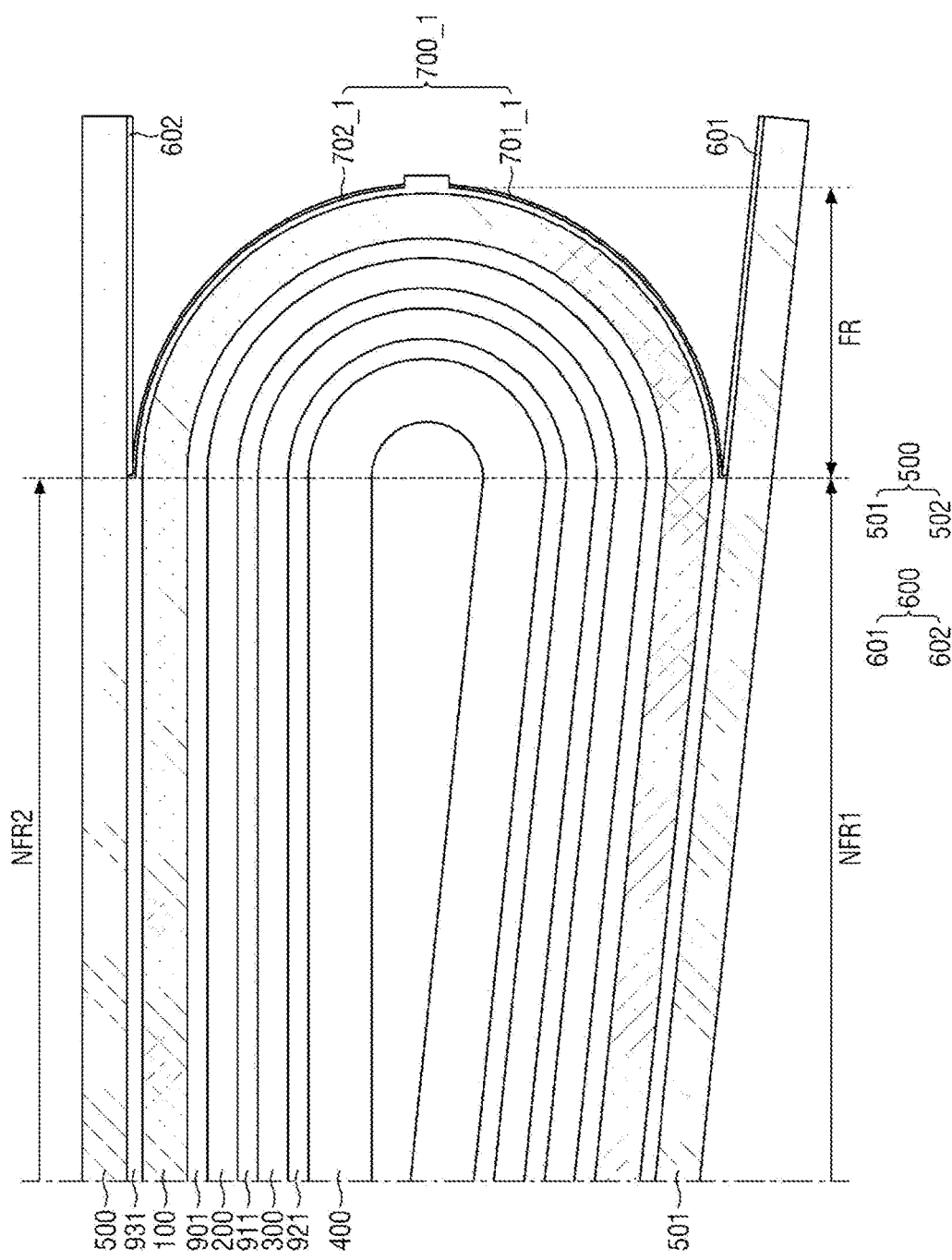

FIGS. 8 and 9 are cross-sectional views of a display device according to another exemplary embodiment and a folded state thereof, respectively.

Referring to FIGS. 8 and 9, there is a difference from the exemplary embodiments of FIGS. 1 to 5 in that in a display device 3 according to the illustrated exemplary embodiment, an adhesive protection layer 700_1 extends to the outside of the outer side surfaces 601s2 and 602s2 of the anti-adhesive layer to cover the outer side surfaces 601s2 and 602s2. In an exemplary embodiment, the adhesive protection layer 700_1 may include a first adhesive protection layer 701_1 disposed on the first anti-adhesive layer 601 and a second adhesive protection layer 702_1 disposed on the second anti-adhesive layer 602.

More specifically, as described above, the anti-adhesive layer 600 may be disposed in a region where the support plate 500 and the folding region FR overlap with each other. The anti-adhesion layer 600 may be surface-treated to improve a peeling property with an adhesive film (for example, PSA, OCA, and OCR). However, the thickness $t_{600}/t_{601}/t_{602}$ of the anti-adhesion layer 600 in the thickness direction may be about 10 nm to about 20 nm, for example. In this case, due to the thin thickness of the anti-adhesive layer 600, the anti-adhesive layer 600 is peeled (or broken) by external impacts or foreign substances to generate the adhesive force of the flexible module MODULE_F with the support plate 500 of the lower surface 600b of the anti-adhesive layer 600, thereby eventually causing internal modification of the foldable display device 3.

Therefore, in the display device 3 according to the illustrated exemplary embodiment, the adhesive protection layer 700_1 extends outside the outer side surfaces 601s2 and 602s2 of the anti-adhesive layer 600 to cover and protect the outer side surfaces 601s2 and 602s2 of the anti-adhesive layer 600, thereby preventing the internal modification of the display device 3.

Even in the illustrated exemplary embodiment, in the display device 3, an adhesive film (for example, the fourth adhesive film 931) may be disposed throughout the folding region FR and the non-folding regions NFR1 and NFR2 to adhere the support plate 500 and the flexible module MODULE_F integrally on the support plate 500. In this case, as described above, the anti-adhesive layer 600 is disposed on the upper surfaces 501a and 502a overlapping with the folding region FR of the support plate 500 and simply, the adhesive film (for example, the fourth adhesive film 931) is attached onto the support plate 500, thereby manufacturing the display device 3. That is, in order to form a non-attachment region corresponding to the folding region FR, a process of aligning to install a separate member (for example, a separate step compensation member disposed in the folding region FR by forming the adhesive film only in the non-folding regions NFR1 and NFR2) is not desired, and thus, it is possible to simplify the manufacturing process and prevent the occurrence of defects due to alignment errors or the like.

Further, when the display device 3 is in the folded state, the foreign substances between the adhesive film (for example, the fourth adhesive film 931) adhering the support plate 500 and the flexible module MODULE_F and the housing (not illustrated) are adhered to the adhesive film (for example, the fourth adhesive film 931) to prevent the internal modification of the display device 3 from occurring.

Further, the adhesive protection layer 700 supports the adhesive film (for example, the fourth adhesive film 931) to prevent aggregation inside the adhesive film (for example, the fourth adhesive film 931) by a self-cohesive force (alternatively, an adhesive force) of the adhesive film (for example, the fourth adhesive film 931).

Figure 10:
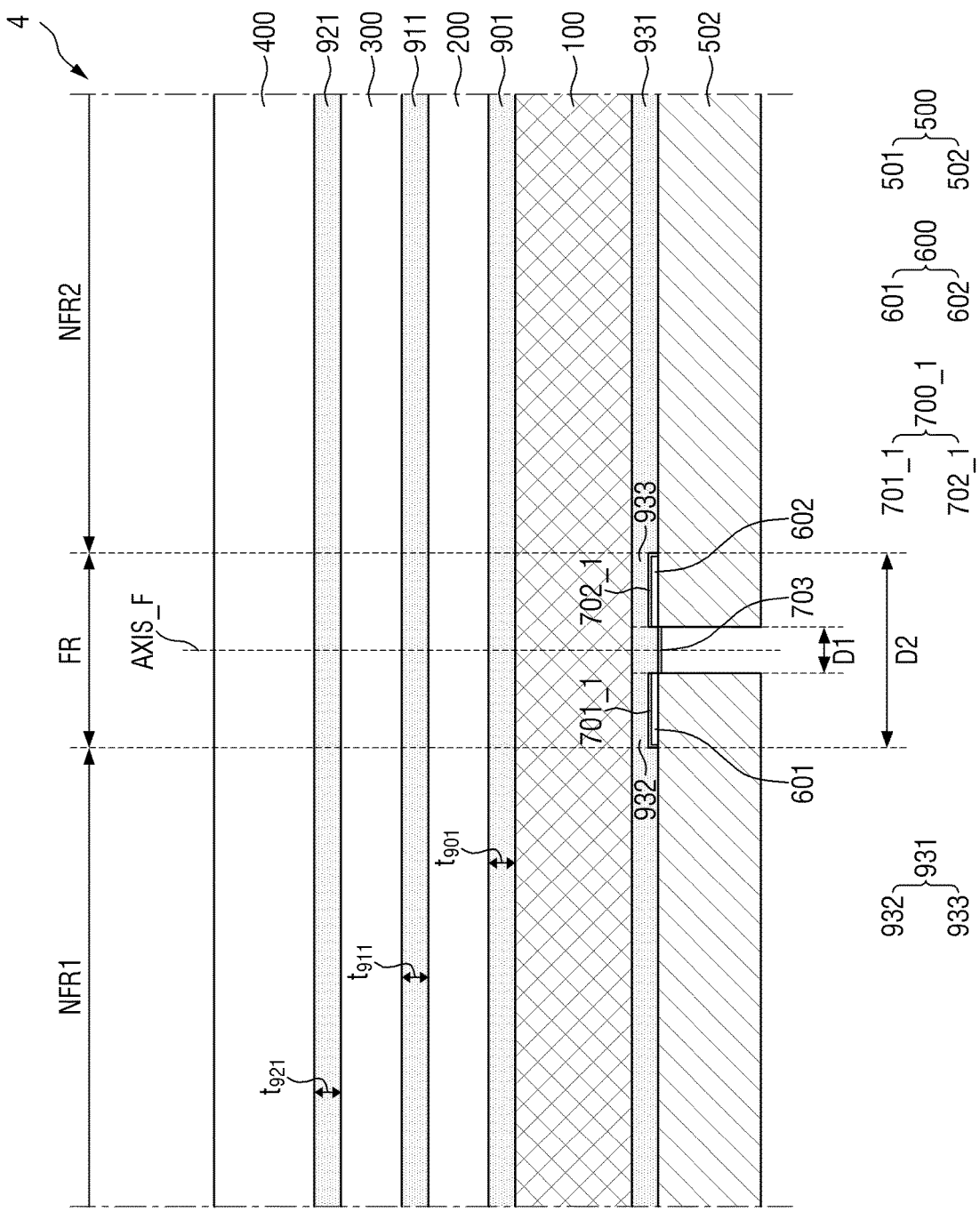
FIGS. 10 and 11 are cross-sectional views of another exemplary embodiment of a display device and a folded state thereof, respectively.
Figure 11:
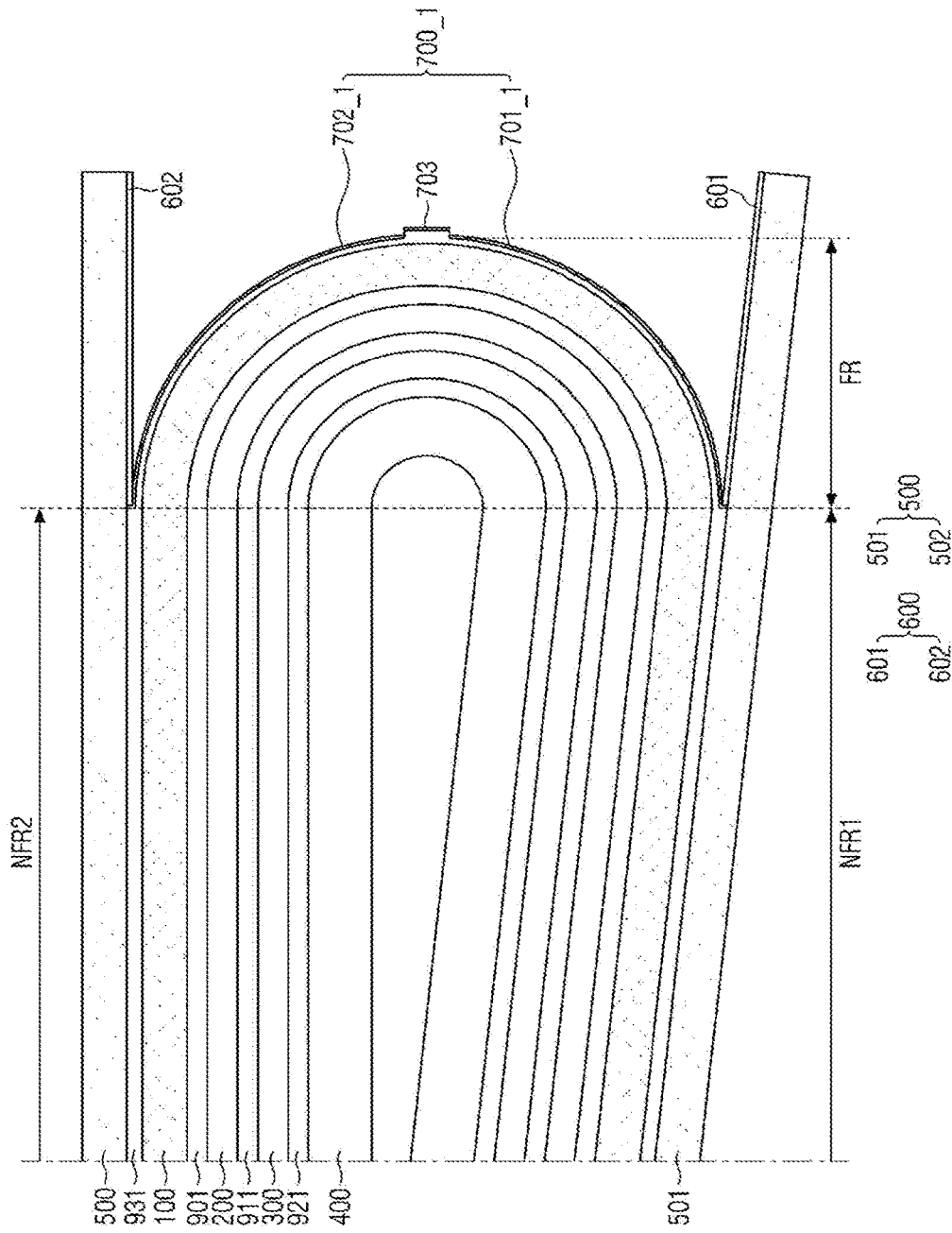

FIGS. 10 and 11 are cross-sectional views of a display device according to another exemplary embodiment and a folded state thereof, respectively.

Referring to FIGS. 10 and 11, there is a difference from the exemplary embodiments of FIGS. 1 to 5 in that a display device 4 according to the illustrated exemplary embodiment further includes the adhesive protection layer 703 of FIGS. 6 and 7 and has the adhesive protection layer 700_1 of FIGS. 8 and 9.

Even in the illustrated exemplary embodiment, the adhesive protection layer 703 may be further disposed on the exposed upper surface of the fourth adhesive film 931 to protect the exposed region of the fourth adhesive film 931.

In addition, the adhesive protection layer 700_1 extends outside the outer side surfaces 601s2 and 602s2 of the anti-adhesive layer 600 to cover the outer side surfaces 601s2 and 602s2 and protects the side surfaces 601s2 and 602s2 of the anti-adhesive layer 600, thereby preventing the internal modification of the display device 4.

Further, in the display device 4, an adhesive film (for example, the fourth adhesive film 931) may be disposed throughout the folding region FR and the non-folding regions NFR1 and NFR2 to adhere the support plate 500 and the flexible module MODULE_F integrally on the support plate 500. In this case, as described above, the anti-adhesive layer 600 is disposed on the upper surfaces 501a and 502a overlapping with the folding region FR of the support plate and simply, the adhesive film (for example, the fourth adhesive film 931) is attached onto the support plate 500, thereby manufacturing the display device 4. That is, in order to form a non-attachment region corresponding to the folding region FR, a process of aligning to install a separate member (for example, a separate step compensation member disposed in the folding region FR by forming the adhesive film only in the non-folding regions NFR1 and NFR2) is not desired, and thus, it is possible to simplify the manufacturing process and prevent the occurrence of defects due to alignment errors or the like.

Further, when the display device 4 is in the folded state, the foreign substances between the adhesive film (for example, the fourth adhesive film 931) adhering the support plate 500 and the flexible module MODULE_F and the housing (not illustrated) are adhered to the adhesive film (for example, the fourth adhesive film 931) to prevent the internal modification of the display device 4 from occurring.

Further, the adhesive protection layer 700 supports the adhesive film (for example, the fourth adhesive film 931) to prevent aggregation inside the adhesive film (for example, the fourth adhesive film 931) by a self-cohesive force (alternatively, an adhesive force) of the adhesive film (for example, the fourth adhesive film 931).

Figure 12:
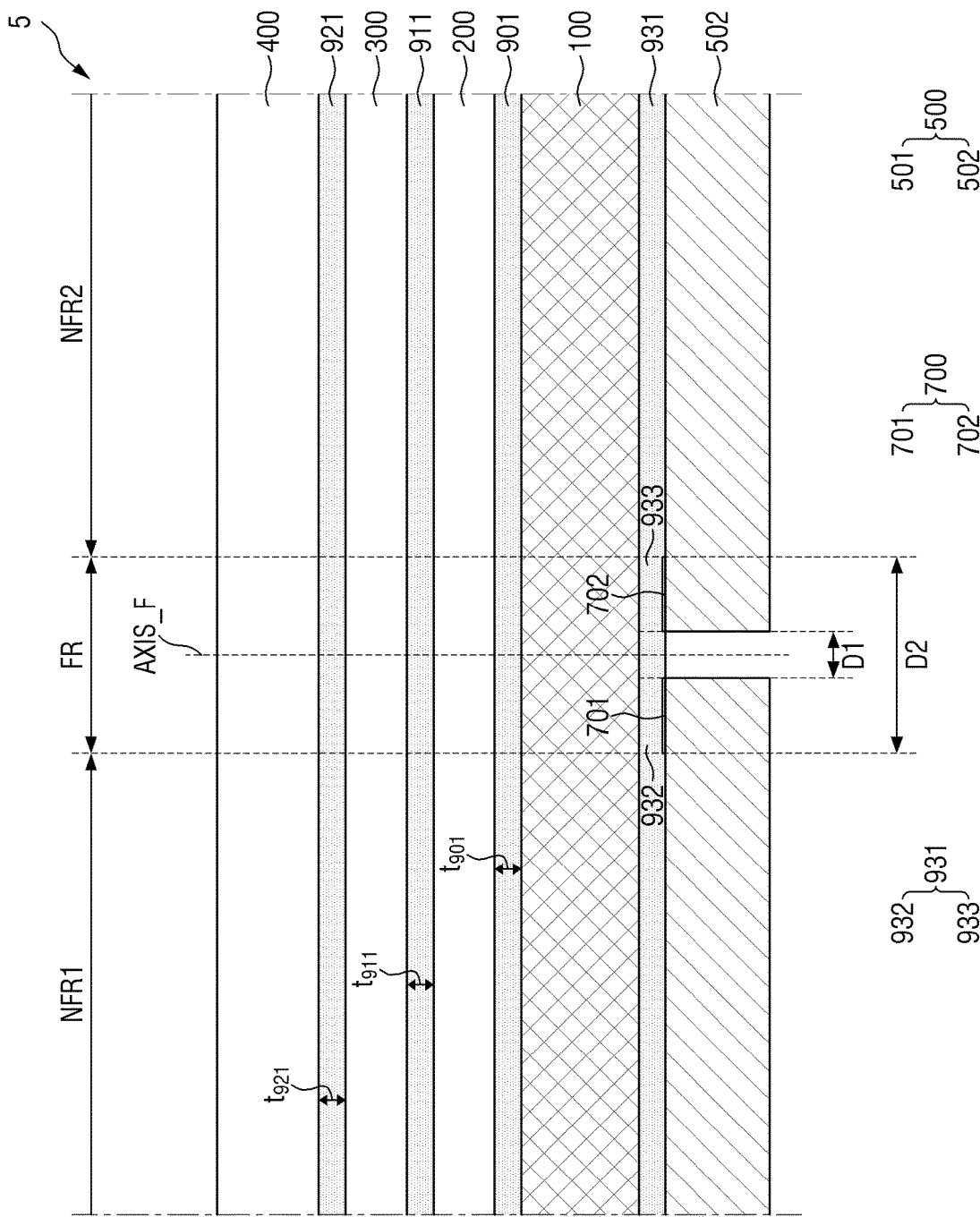
FIGS. 12 and 13 are cross-sectional views of another exemplary embodiment of a display device and a folded state thereof, respectively.
Figure 13:
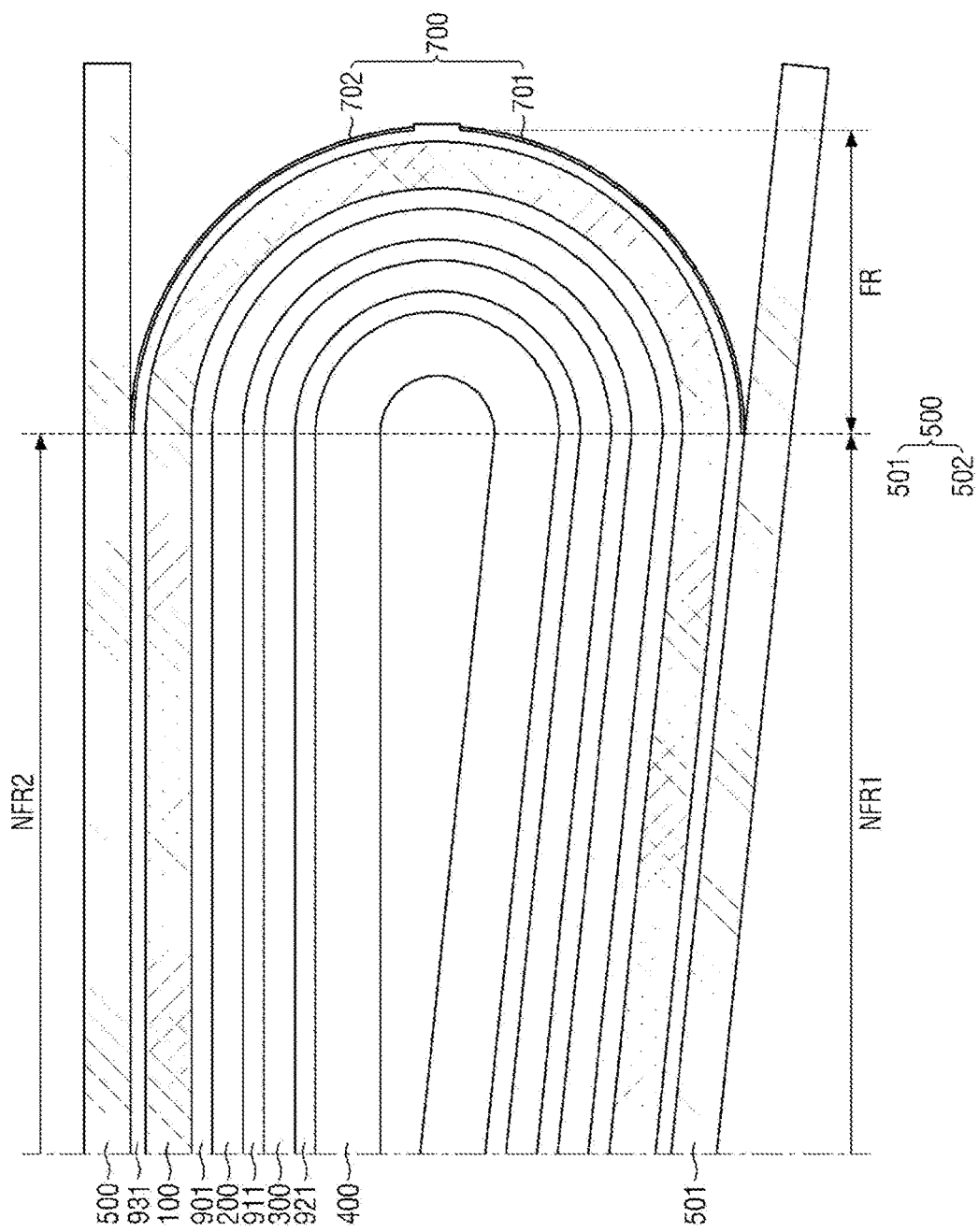

FIGS. 12 and 13 are cross-sectional views of a display device according to another exemplary embodiment and a folded state thereof, respectively.

Referring to FIGS. 12 and 13, there is a difference from the exemplary embodiments of FIGS. 1 to 5 in that a display device 5 of the illustrated exemplary embodiment does not include the anti-adhesive layer 600.

More specifically, the adhesive protection layer 700 may be disposed in a region where the support plate 500 and the folding region FR overlap with each other. In the illustrated exemplary embodiment, the adhesive protection layer 700 may prevent adhesion between the flexible module MODULE_F and the support plate 500 in the folding region FR. Furthermore, the anti-adhesive layer 600 is omitted to reduce the entire thickness of the display device 5, thereby achieving slimness.

Even in the illustrated exemplary embodiment, in the display device 5, an adhesive film (for example, the fourth adhesive film 931) may be disposed throughout the folding region FR and the non-folding regions NFR1 and NFR2 to adhere the support plate 500 and the flexible module MODULE_F integrally on the support plate 500. In this case, as described above, the adhesive protection layer 700 is disposed on the upper surfaces 501a and 502a overlapping with the folding region FR of the support plate 500 and simply, the adhesive film (for example, the fourth adhesive film 931) is attached onto the support plate 500, thereby manufacturing the display device 5. That is, in order to form a non-attachment region corresponding to the folding region FR, a process of aligning to install a separate member (for example, a separate step compensation member disposed in the folding region FR by forming the adhesive film only in the non-folding regions NFR1 and NFR2) is not desired, and thus, it is possible to simplify the manufacturing process and prevent the occurrence of defects due to alignment errors or the like.

Further, when the display device 5 is in the folded state, the foreign substances between the adhesive film (for example, the fourth adhesive film 931) adhering the support plate 500 and the flexible module MODULE_F and the housing (not illustrated) are adhered to the adhesive film (for example, the fourth adhesive film 931) to prevent the internal modification of the display device 5 from occurring.

Further, the adhesive protection layer 700 supports the adhesive film (for example, the fourth adhesive film 931) to prevent aggregation inside the adhesive film (for example, the fourth adhesive film 931) by a self-cohesive force (alternatively, an adhesive force) of the adhesive film (for example, the fourth adhesive film 931).

Figure 14:
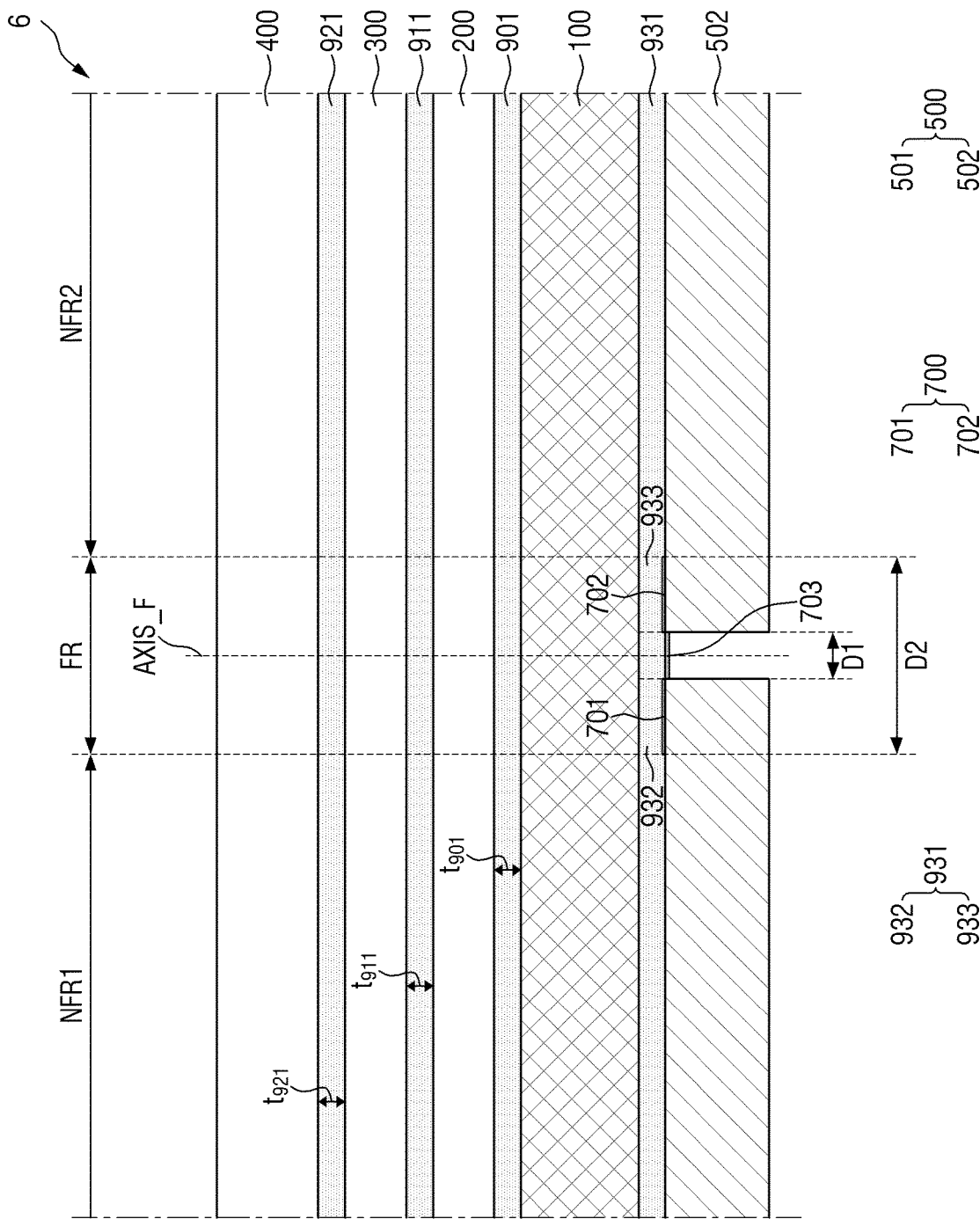
FIGS. 14 and 15 are cross-sectional views of another exemplary embodiment of a display device and a folded state thereof, respectively.
Figure 15:
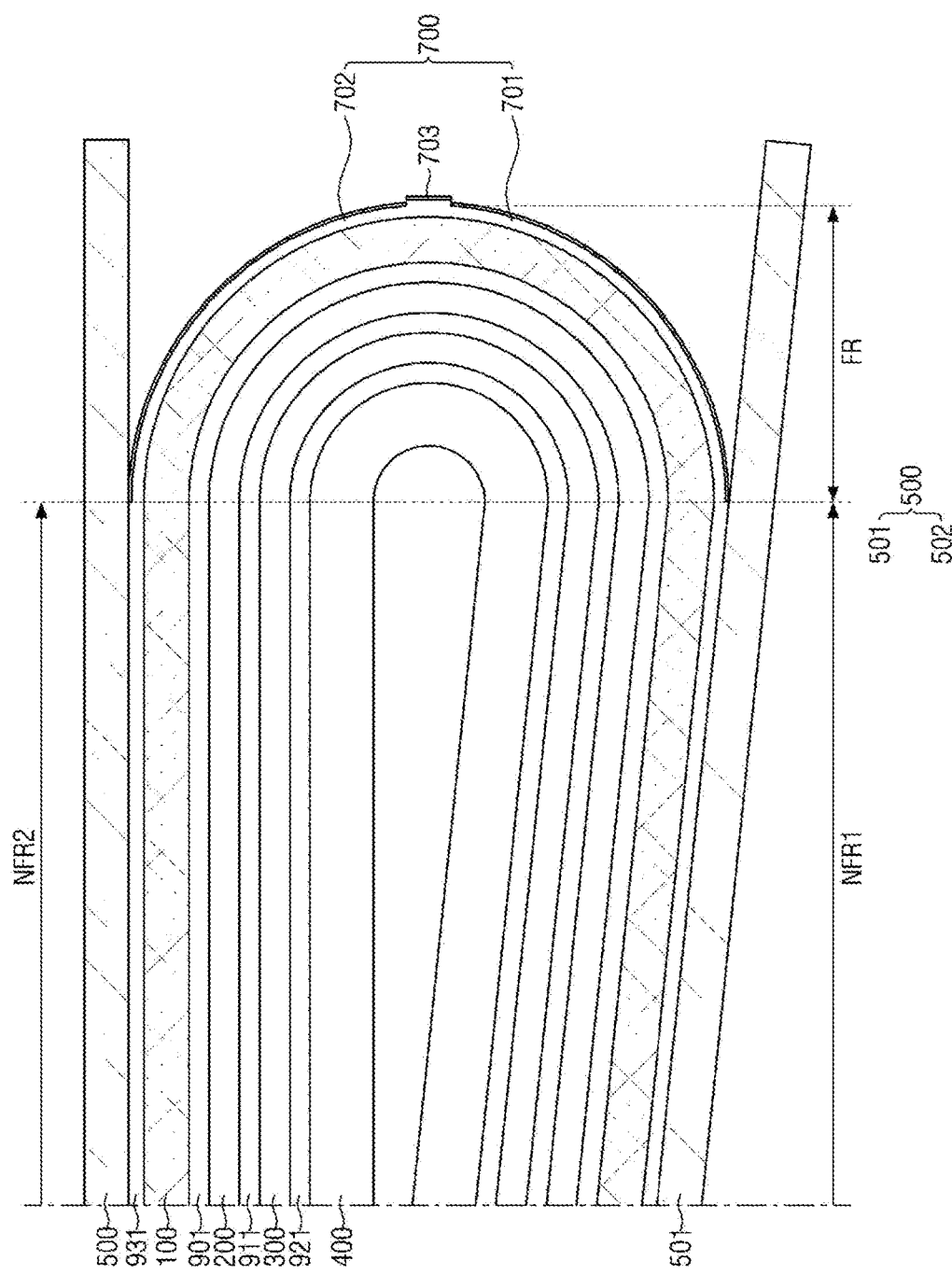

FIGS. 14 and 15 are cross-sectional views of a display device according to another exemplary embodiment and a folded state thereof, respectively.

Referring to FIGS. 14 and 15, there is a difference from the exemplary embodiments of FIGS. 1 to 5 in that a display device 6 according to the illustrated exemplary embodiment further includes the adhesive protection layer 703 of FIGS. 6 and 7 and does not include the anti-adhesive layer 600 as illustrated in FIGS. 12 and 13.

Even in the illustrated exemplary embodiment, the adhesive protection layer 703 may be further disposed on the exposed upper surface of the fourth adhesive film 931 to protect the exposed region of the fourth adhesive film 931.

Further, in the display device 6, an adhesive film (for example, the fourth adhesive film 931) may be disposed throughout the folding region FR and the non-folding regions NFR1 and NFR2 to adhere the support plate 500 and the flexible module MODULE_F integrally on the support plate 500. In this case, as described above, the adhesive protection layer 700 is disposed on the upper surfaces 501a and 502a overlapping with the folding region FR of the support plate 500 and simply, the adhesive film (for example, the fourth adhesive film 931) is attached onto the support plate 500, thereby manufacturing the display device 6. That is, in order to form a non-attachment region corresponding to the folding region FR, a process of aligning to install a separate member (for example, a separate step compensation member disposed in the folding region FR by forming the adhesive film only in the non-folding regions NFR1 and NFR2) is not desired, and thus, it is possible to simplify the manufacturing process and prevent the occurrence of defects due to alignment errors or the like.

Further, when the display device 6 is in the folded state, the foreign substances between the adhesive film (for example, the fourth adhesive film 931) adhering the support plate 500 and the flexible module MODULE_F and the housing (not illustrated) are adhered to the adhesive film (for example, the fourth adhesive film 931) to prevent the internal modification of the display device 6 from occurring.

Further, the adhesive protection layer 700 supports the adhesive film (for example, the fourth adhesive film 931) to prevent aggregation inside the adhesive film (for example, the fourth adhesive film 931) by a self-cohesive force (alternatively, an adhesive force) of the adhesive film (for example, the fourth adhesive film 931).

Figure 16:
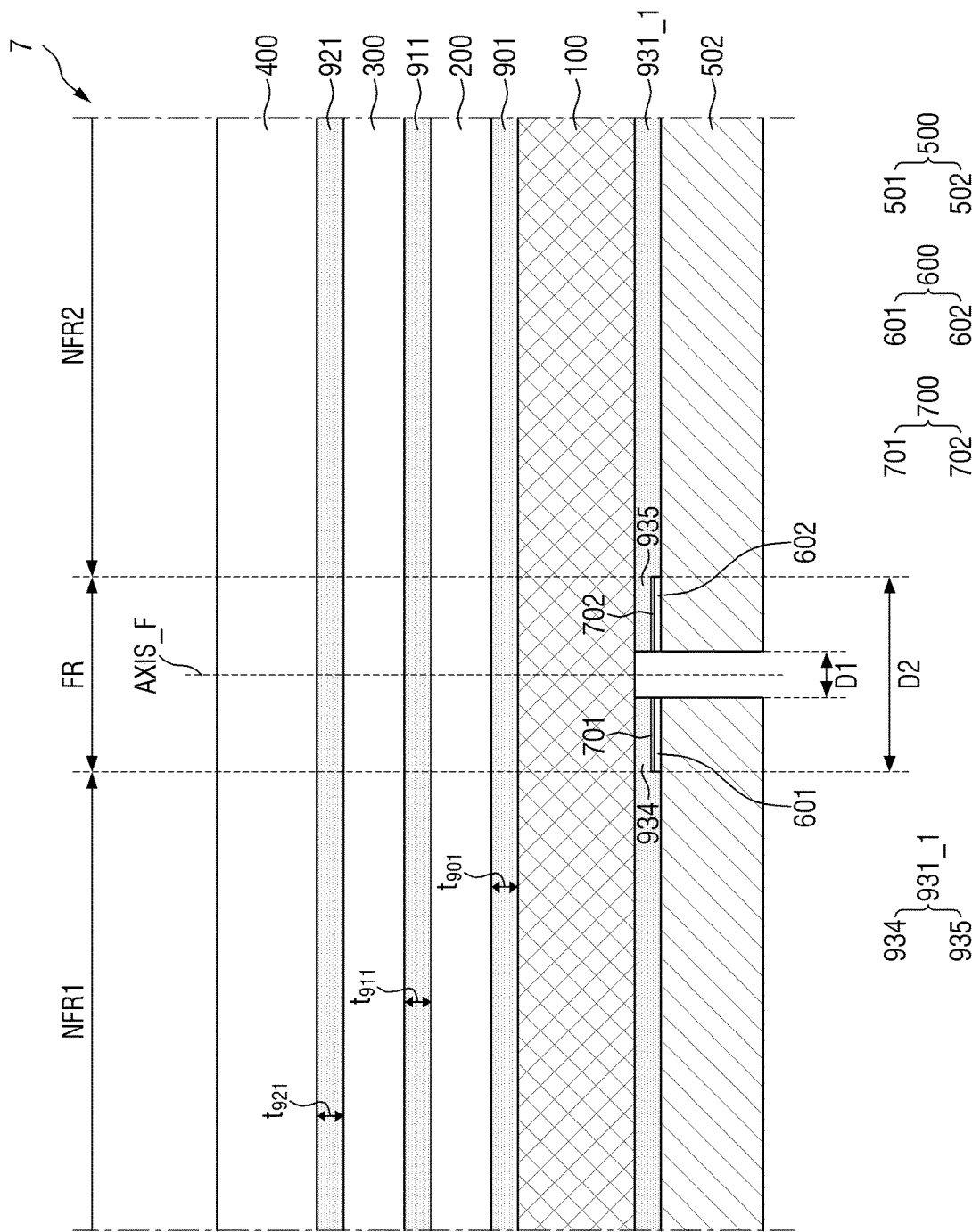
FIGS. 16 and 17 are cross-sectional views of another exemplary embodiment of a display device and a folded state thereof, respectively.
Figure 17:
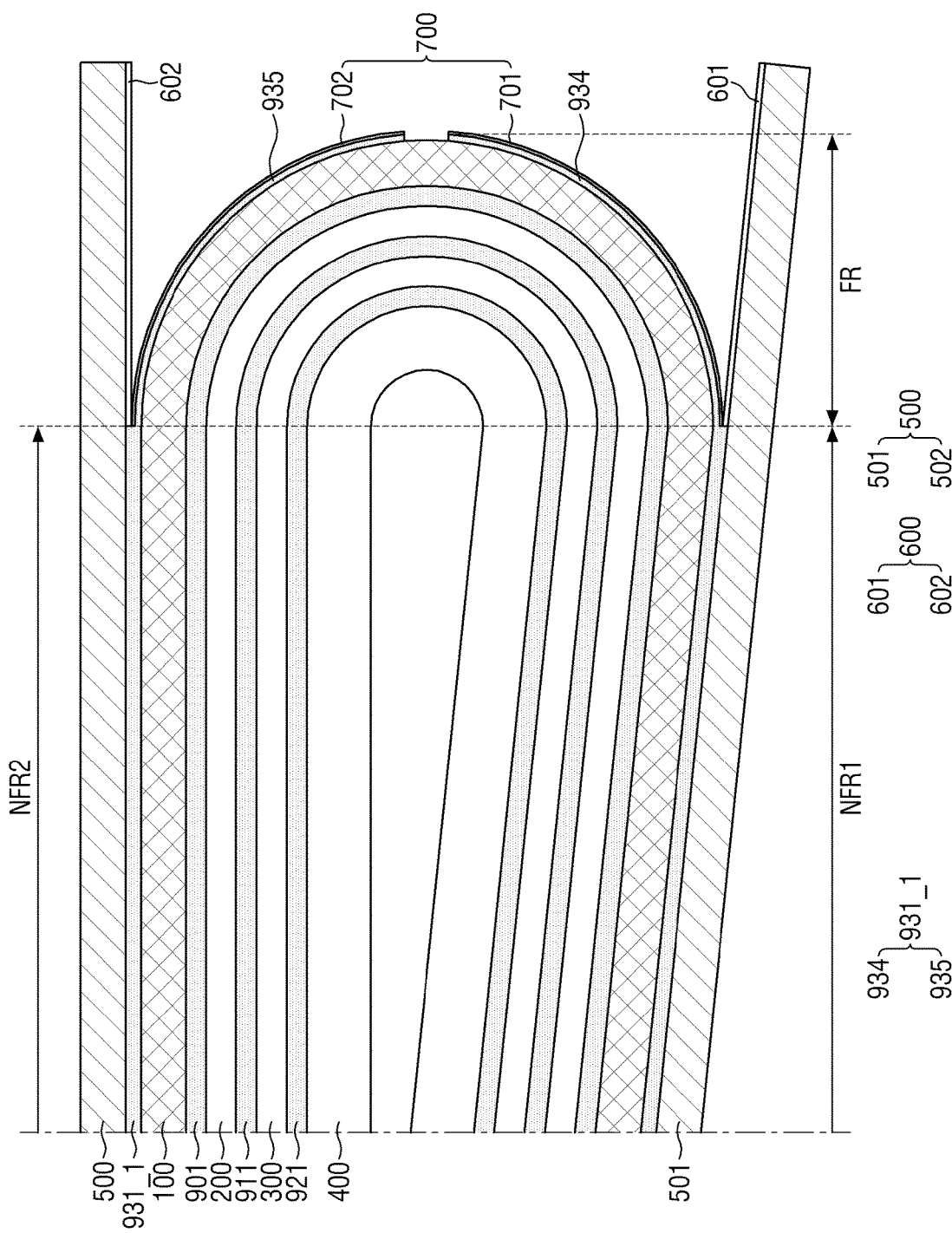

FIGS. 16 and 17 are cross-sectional views of a display device according to another exemplary embodiment and a folded state thereof, respectively.

Referring to FIGS. 16 and 17, there is a difference from the exemplary embodiments of FIGS. 1 to 5 in that a display device 7 according to the illustrated exemplary embodiment includes adhesive films 934 and 935 which are spaced apart from each other in a region where the fourth adhesive film 931_1 overlaps with the folding axis AXIS_F.

Even in the illustrated exemplary embodiment, when the display device 7 is in the folded state, the foreign substances between the adhesive film (for example, the fourth adhesive film 931_1) adhering the support plate 500 and the flexible module MODULE_F and the housing (not illustrated) are adhered to the adhesive film (for example, the fourth adhesive film 931_1) to prevent the internal modification of the display device 7 from occurring.

Further, the adhesive protection layer 700 supports the adhesive film (for example, the fourth adhesive film 931_1) to prevent aggregation inside the adhesive film (for example, the fourth adhesive film 931_1) by a self-cohesive force (alternatively, an adhesive force) of the adhesive film (for example, the fourth adhesive film 931_1).

As described above, according to the display device 7 of the exemplary embodiment of the invention, it is possible to prevent internal modification of the display device by adhesion of foreign substances and the like, aggregation of an adhesive material (e.g., PSA), or the like.

The effects of the exemplary embodiments are not limited by the contents exemplified above, and other various effects are included in the specification.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A display device comprising:
a flexible module including a display panel which displays an image;
a first adhesive film disposed on one surface of the flexible module;
a first support plate and a second support plate which are disposed on the first adhesive film, opposed to the flexible module, and spaced apart from each other, respectively;
a first adhesive protection layer and a first anti-adhesive layer disposed between the first support plate and the first adhesive film and facing each other; and
a second adhesive protection layer and a second anti-adhesive layer disposed between the second support plate and the first adhesive film and facing each other;
wherein a first bonding force between the first anti-adhesive layer and the first support plate and a second bonding force between the first adhesive protection layer and the first adhesive film are larger than a third bonding force between the first adhesive protection layer and the first anti-adhesive layer, and
a side surface of the first adhesive protection layer and a side surface of the first anti-adhesive layer are aligned with a side surface of the first support plate.

2. The display device of claim 1,
wherein a fourth bonding force between the second anti-adhesive layer and the second support plate and a fifth bonding force between the second adhesive protection layer and the second adhesive film are larger than a sixth bonding force between the second adhesive protection layer and the second anti-adhesive layer, and
one side surfaces of the second adhesive protection layer and the second anti-adhesive layer are aligned with one side surface of the second support plate.

3. The display device of claim 2,
wherein in a region where the first anti-adhesive layer and the first adhesive protection layer are exposed, the flexible module is directly bonded with the first support plate overlapped in a thickness direction.

4. The display device of claim 3,
wherein in a region where the second anti-adhesive layer and the second adhesive protection layer are exposed, the flexible module is directly bonded with the second support plate overlapped in the thickness direction.

5. The display device of claim 4,
wherein the first adhesive film is in contact with the side surfaces of the first adhesive protection layer and the first anti-adhesive layer and in contact with a side surface of the second adhesive protection layer and a side surface of the second anti-adhesive layer.

6. The display device of claim 1,
wherein the first adhesive protection layer and the second adhesive protection layer include inorganic materials.

7. The display device of claim 6,
wherein the first anti-adhesive layer and the second anti-adhesive layer include at least one of olefin, silicon, long-chain alkyl, and fluorine-based molecules.

8. The display device of claim 7,
wherein thicknesses of the first adhesive protection layer and the second adhesive protection layer are about 1 nanometer to about 10 nanometers.

9. The display device of claim 8,
wherein thicknesses of the first anti-adhesive layer and the second anti-adhesive layer are about 10 nanometers to about 20 nanometers.

10. The display device of claim 9,
wherein the first adhesive film includes a pressure sensitive adhesive.

11. The display device of claim 1,
wherein the flexible module further includes:
a lower functional layer disposed on the display panel and disposed between the display panel and the first adhesive film;
an upper functional layer disposed on the display panel and spaced apart from the lower functional layer with the display panel interposed therebetween; and
a window member disposed on the upper functional layer and spaced apart from the display panel with the upper functional layer interposed therebetween,
wherein the lower functional layer, the display panel, the upper functional layer, and the window member face each other.

12. The display device of claim 11,
wherein the flexible module further includes:
a second adhesive film for bonding the lower functional layer and the display panel;
a third adhesive film for bonding the display panel and the upper functional layer; and
a fourth adhesive film for bonding the upper functional layer and the window member.

13. The display device of claim 12,
wherein the window member includes glass, and a thickness of the window member is equal to or less than about 100 micrometers.

14. The display device of claim 13,
wherein a thickness of the first adhesive film is smaller than a thickness of the second adhesive film, the third adhesive film, and the fourth adhesive film.

15. A display device which includes a first region, a second region, a third region, a fourth region and a fifth region adjacent to each other, the display device further comprising:
a flexible module;
a first adhesive film disposed on the flexible module;
a first adhesive protection layer and a second adhesive protection layer disposed on the first adhesive film;
a first support plate and a second support plate facing the flexible module;
a first anti-adhesive layer disposed on the first support plate; and
a second anti-adhesive layer disposed on the second support plate,
wherein the flexible module and the first adhesive film are disposed over the first region to the fifth region,
the first support plate is disposed over the first region and the second region,
the first anti-adhesive layer and the first adhesive protection layer are disposed in the second region,
the second support plate is disposed over the fourth region and the fifth region,
the second anti-adhesive layer and the second adhesive protection layer are disposed in the fourth region,
the first anti-adhesive layer and the first adhesive protection layer face each other,
the second anti-adhesive layer and the second adhesive protection layer face each other,
first side surfaces of the first support plate, the first adhesive protection layer, and the first anti-adhesive layer are aligned on a boundary between the second region and the third region, respectively,
second side surfaces of the second support plate, the second adhesive protection layer, and the second anti-adhesive layer are aligned on a boundary between the third region and the fourth region, respectively,
the first side surfaces and the second side surfaces are spaced apart from each other with the third region interposed therebetween to face each other,
the first anti-adhesive layer is bonded onto the first support plate,
the second anti-adhesive layer is bonded onto the second support plate,
the first adhesive protection layer and the second adhesive protection layer are bonded onto the first adhesive film,
the first support plate is directly bonded to the first adhesive film in the first region, and
the second support plate is directly bonded to the first adhesive film in the fifth region.

16. The display device of claim 15,
wherein the first adhesive protection layer and the second adhesive protection layer include inorganic materials, and
the first anti-adhesive layer and the second anti-adhesive layer include at least one of olefin, silicon, long-chain alkyl, and fluorine-based molecules.

17. The display device of claim 16,
wherein thicknesses of the first adhesive protection layer and the second adhesive protection layer are 1 nanometer to 10 nanometers, and thicknesses of the first anti-adhesive layer and the second anti-adhesive layer are 10 nanometers to 20 nanometers.

18. The display device of claim 17,
wherein the flexible module further includes:
a display panel;
a lower functional layer disposed on the display panel and disposed between the display panel and the first adhesive film;
an upper functional layer disposed on the display panel and spaced apart from the lower functional layer with the display panel interposed therebetween;
a window member disposed on the upper functional layer and spaced apart from the display panel with the upper functional layer interposed therebetween;
a second adhesive film for bonding the lower functional layer and the display panel;
a third adhesive film for bonding the display panel and the upper functional layer; and
a fourth adhesive film for bonding the upper functional layer and the window member.

19. The display device of claim 18,
wherein a thickness of the first adhesive film is smaller than a thickness of the second adhesive film, the third adhesive film, and the fourth adhesive film, and
the first adhesive film to the fourth adhesive film include a pressure sensitive adhesive.

20. The display device of claim 19,
wherein the window member includes glass, and the thickness of the window member is equal to or less than about 100 micrometers.

* * * * *